United States Patent
Kiehlbauch et al.

(10) Patent No.: US 8,507,380 B2
(45) Date of Patent: Aug. 13, 2013

(54) METHODS OF FORMING CONTACT OPENINGS AND METHODS OF INCREASING CONTACT AREA IN ONLY ONE OF X AND Y AXES IN THE FABRICATION OF INTEGRATED CIRCUITRY

(75) Inventors: Mark Kiehlbauch, Boise, ID (US); Anton deVilliers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 240 days.

(21) Appl. No.: 12/815,574

(22) Filed: Jun. 15, 2010

(65) Prior Publication Data

US 2011/0306206 A1 Dec. 15, 2011

(51) Int. Cl.
*H01L 21/44* (2006.01)

(52) U.S. Cl.
USPC .......................... 438/675; 438/587

(58) Field of Classification Search
USPC .................................. 438/587, 675
See application file for complete search history.

(56) References Cited

U.S. PATENT DOCUMENTS

| | | | |
|---|---|---|---|
| 6,121,155 A | 9/2000 | Yang et al. | |
| 6,174,818 B1 | 1/2001 | Tao et al. | |
| 6,423,457 B1 | 7/2002 | Bell | |
| 6,514,871 B1 | 2/2003 | Yang et al. | |
| 6,790,782 B1 * | 9/2004 | Yang et al. | 438/706 |
| 6,835,970 B2 * | 12/2004 | Nam et al. | 438/587 |
| 6,911,399 B2 * | 6/2005 | Liu et al. | 438/725 |
| 7,250,319 B2 * | 7/2007 | Liu et al. | 438/39 |
| 7,883,829 B2 * | 2/2011 | Holmes et al. | 430/270.1 |

OTHER PUBLICATIONS

Rauf, Shahid, 'Model for photoresist trim etch in inductively coupled CF4/O2 plasma,' J. Vac. Sci. Tech. B vol. 22 Iss. 1 Jan./Feb. 2004 p. 202-11.*

* cited by examiner

*Primary Examiner* — Fernando L Toledo
*Assistant Examiner* — Bryan Junge
(74) *Attorney, Agent, or Firm* — Wells St. John, P.S.

(57) ABSTRACT

A method of forming contact openings in the fabrication of integrated circuitry includes forming a mask which includes at least one of photoresist and amorphous carbon received over a plurality of spaced conductive line constructions. The conductive line constructions include insulative caps and insulative sidewalls. The mask includes a plurality of spaced lines and trench spaces between adjacent of the spaced lines. The spaced lines and the trench spaces angle relative to the conductive line constructions. The trench spaces are received over node locations which are received between adjacent of the conductive line constructions. The at least one of photoresist and amorphous carbon is treated with a plasma to reduce lateral width of the spaced lines and to increase lateral width of the trench spaces. After the treating, contact openings are etched to the node locations selectively relative to the insulative caps and the insulative sidewalls.

32 Claims, 22 Drawing Sheets

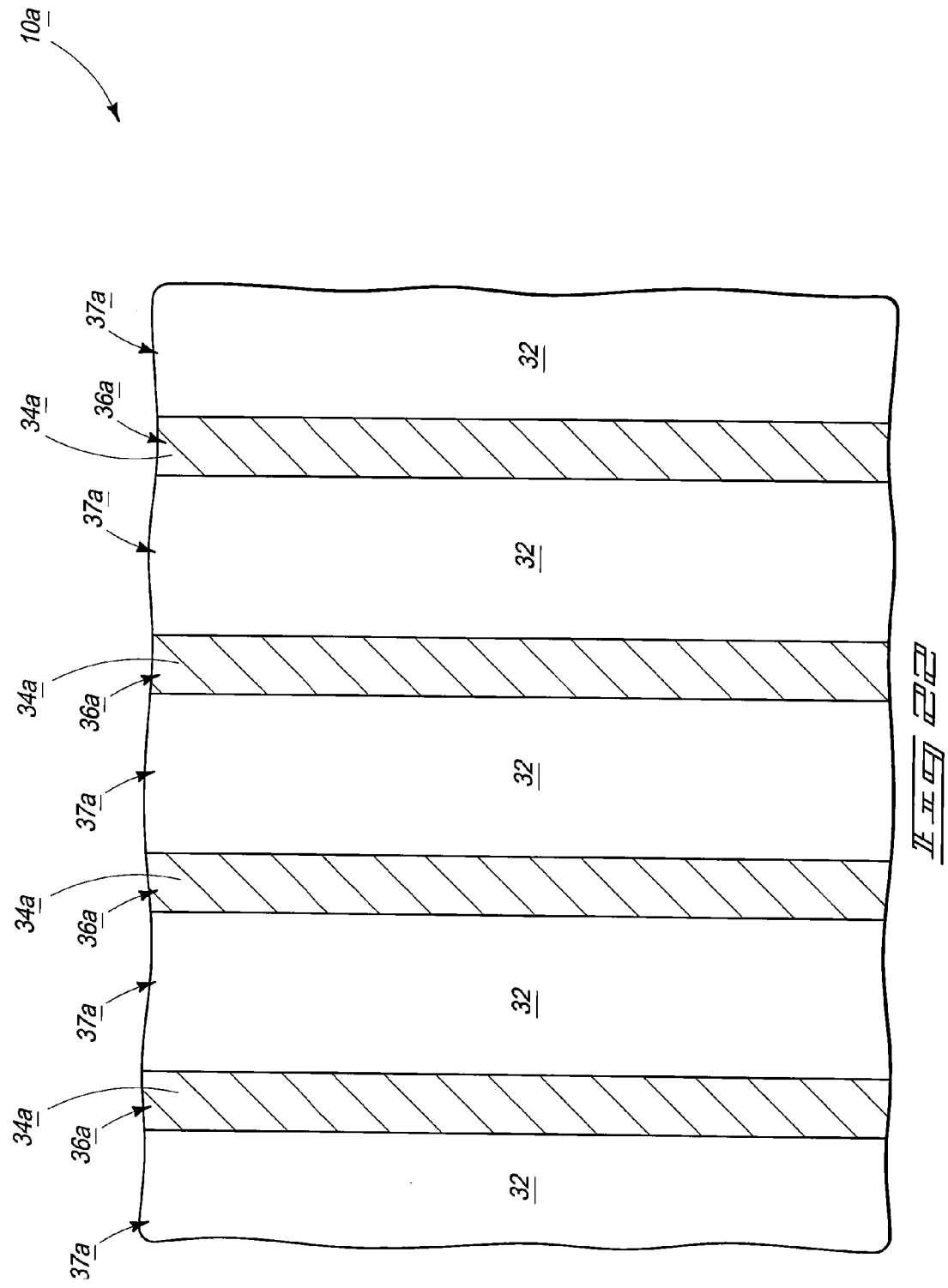

METHODS OF FORMING CONTACT OPENINGS AND METHODS OF INCREASING CONTACT AREA IN ONLY ONE OF X AND Y AXES IN THE FABRICATION OF INTEGRATED CIRCUITRY

TECHNICAL FIELD

Embodiments disclosed herein pertain to methods of forming contact openings and to methods of increasing contact area in the fabrication of integrated circuitry.

BACKGROUND

In the fabrication of integrated circuitry, electronic devices at different elevations within a substrate often need to be electrically connected. One manner of doing so includes initially fabricating a device at one elevation, depositing an insulative material thereover, and etching a contact opening through the insulative material to a desired point of electrical contact of the electronic device. The opening is then filled with conductive material, and the higher elevation device is fabricated over and in electrical connection with the conductive material which has filled the opening. Alternately, another insulative layer may be deposited over the plugged opening, and an opening etched therethrough which is targeted to overlie the conductive material filling the opening in the lower insulative material.

As integrated circuitry has continued to get denser by closer horizontal placement of individual electronic components relative to one another horizontally, the integration density has also tended to increase vertically. Such has led to thicker insulating layers through which contact openings are etched to access underlying electronic devices. A property of any opening to be etched is "aspect ratio", which may be defined as the ratio of the maximum depth of the opening to be etched divided by the minimum lateral opening width of an outermost portion of the opening. It is generally more difficult to etch high aspect ratio openings in comparison to low aspect ratio openings. Further, the larger the outermost/uppermost area of the conductive material of a filled contact opening, the greater the misalignment margin in fabrication and/or use of a mask which is intended to provide an opening through material to such conductive outermost surface.

While the invention was motivated in addressing the above issues, and particularly in the fabrication of contact openings in Dynamic Random Access Memory (DRAM) circuitry, the invention is in no way so limited.

BRIEF DESCRIPTION OF THE DRAWINGS

FIG. 22 is a diagrammatic top plan view of the FIG. 21 substrate at a processing step subsequent to that shown by FIG. 21.

DETAILED DESCRIPTION OF EXAMPLE EMBODIMENTS

Figure 1:
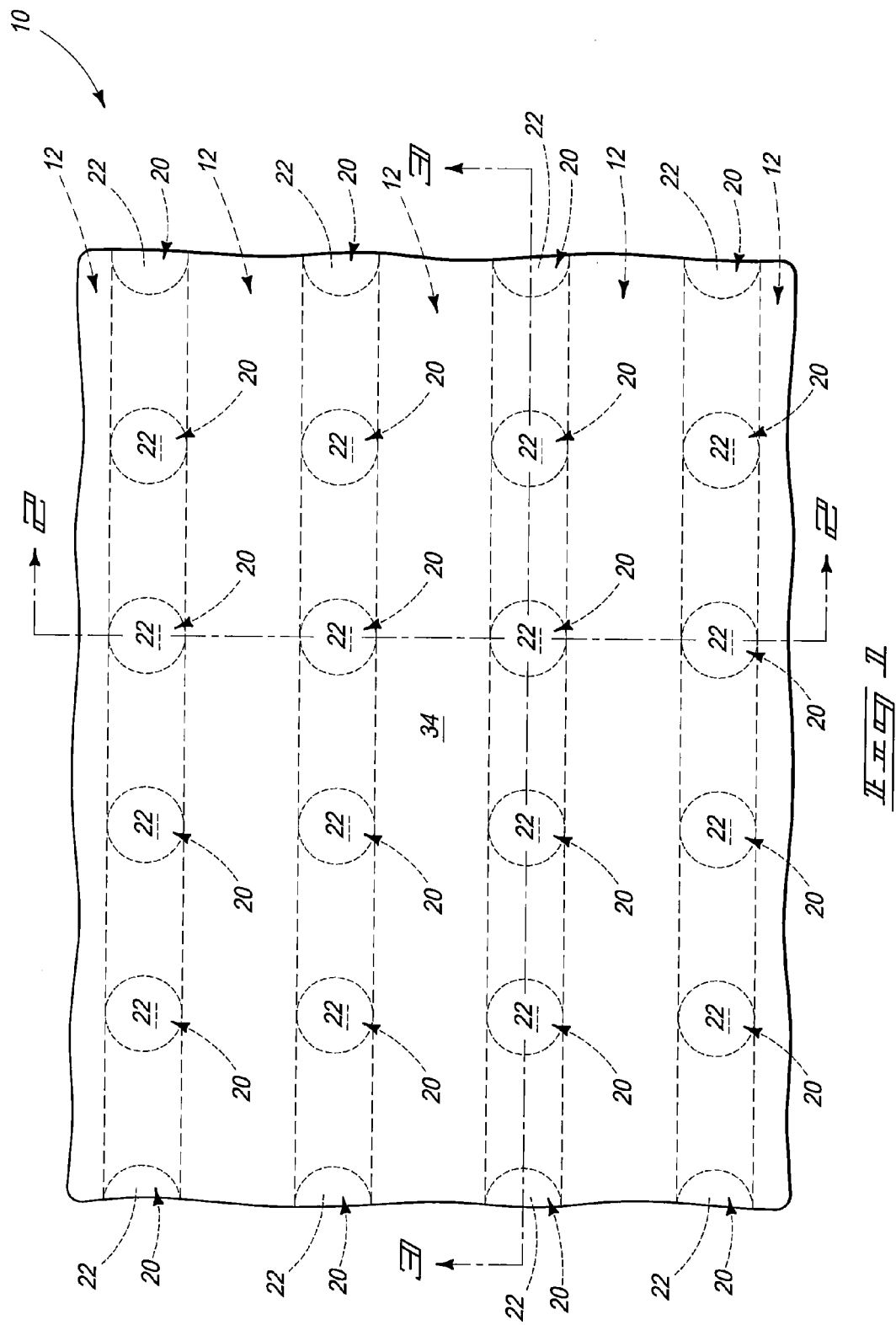
FIG. 1 is a diagrammatic top plan view of a substrate in process in accordance with an embodiment of the invention.
Figure 2:
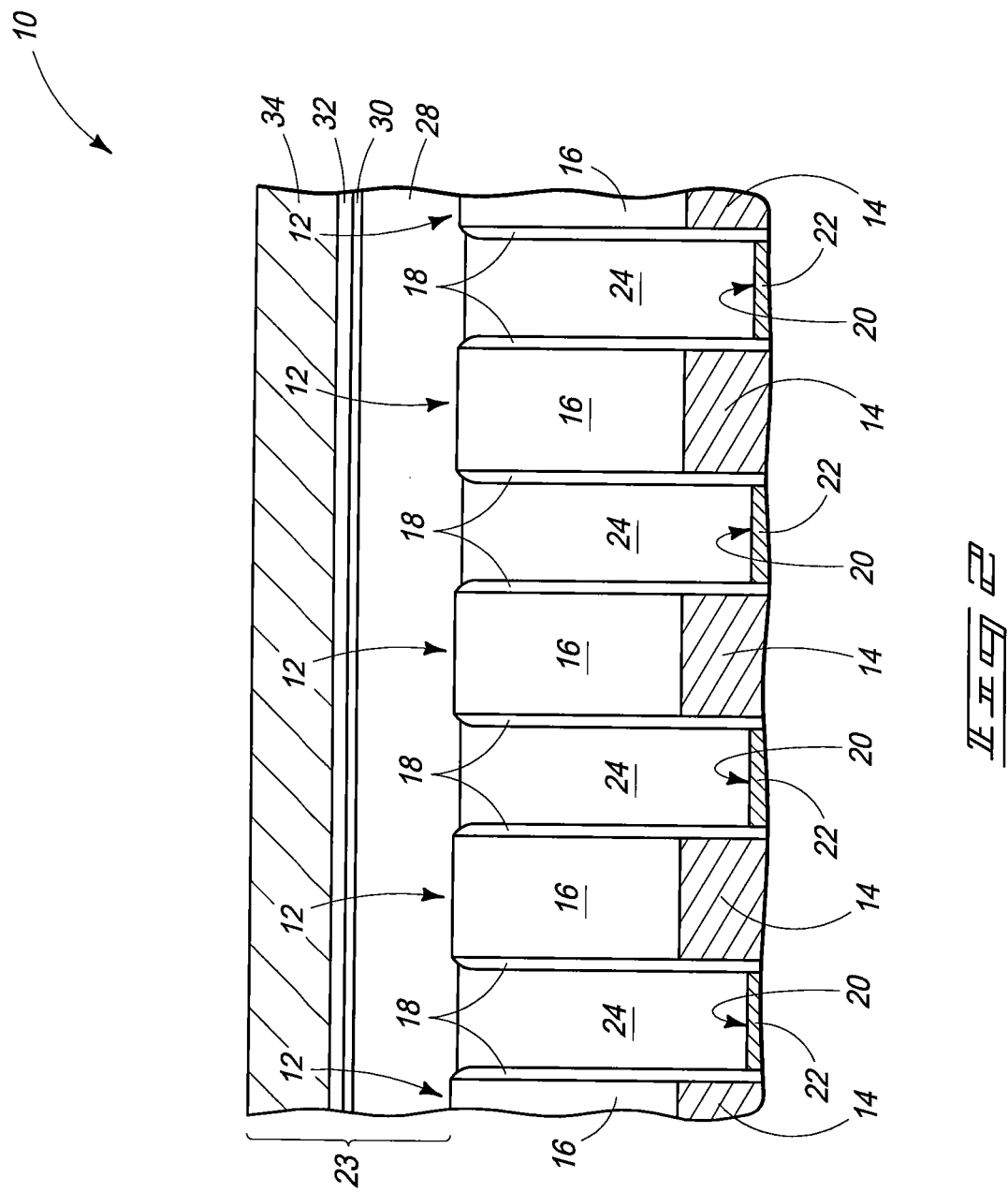
FIG. 2 is a sectional view of taken through line 2-2 in FIG. 1.
Figure 3:
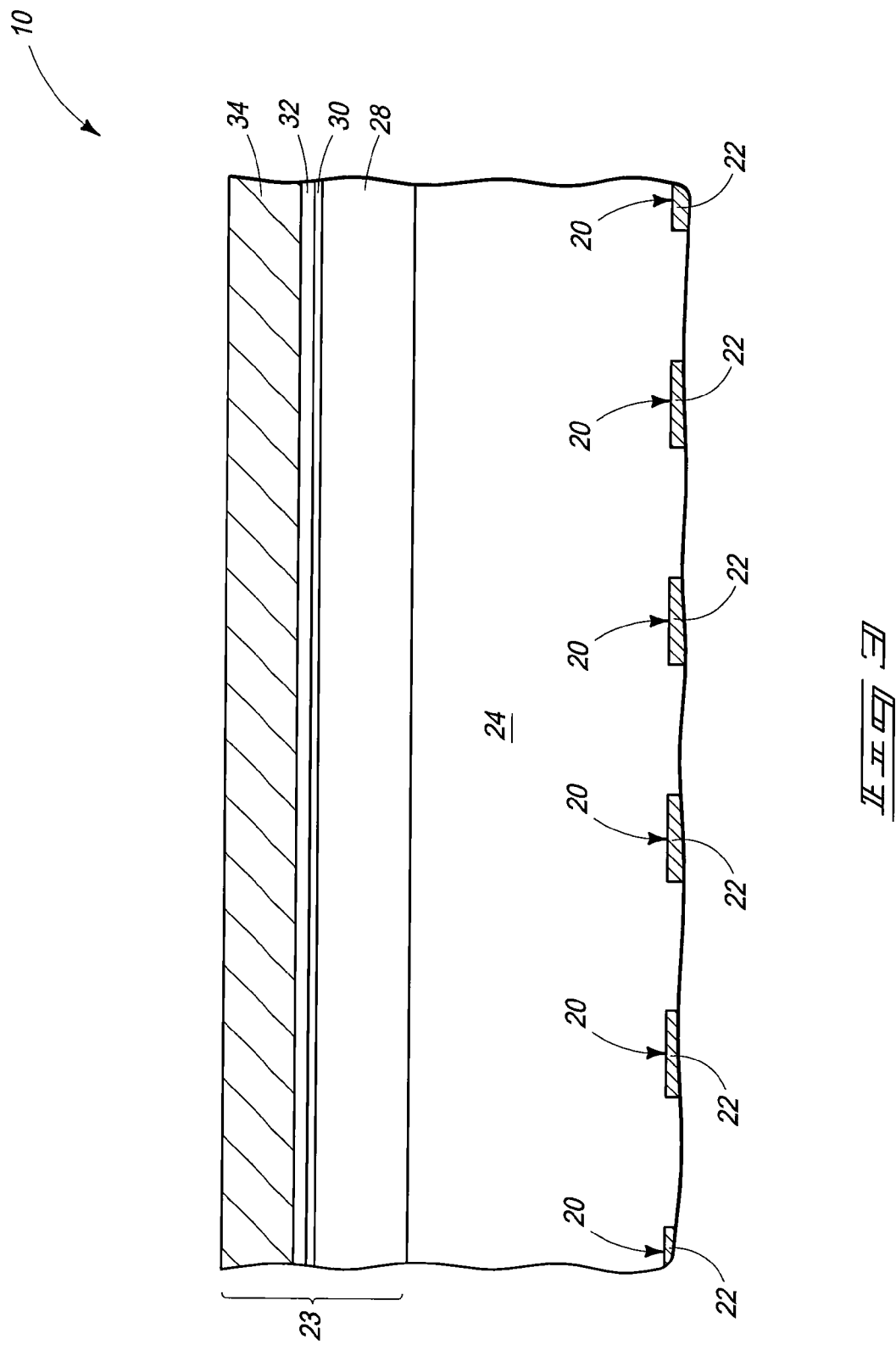
FIG. 3 is a sectional view of taken through line 3-3 in FIG. 1.

Example methods of forming contact openings in the fabrication of integrated circuitry, including forming plugged contact openings, are initially described with reference to FIGS. 1-20. Referring to FIGS. 1-3, a substrate, for example a semiconductor substrate, is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 10 comprises a plurality of spaced conductive line constructions 12 which have been fabricated over suitable underlying material (not shown), for example bulk monocrystalline silicon and/or underlying circuitry. Conductive line constructions 12 individually comprise conductive material 14, insulative caps 16, and insulative sidewalls 18. Example conductive materials include one or a combination of elemental metals, alloys of elemental metals, conductive metal compounds, and conductively doped semiconductive material such as conductively doped polysilicon. Example insulative material for caps 16 and sidewalls 18 include silicon nitride and/or silicon dioxide. Alternate conductive line constructions may be used.

Node locations 20 are received between adjacent conductive line constructions 12 and constitute example target areas to which contact openings are to be formed. In one embodiment, node locations 20 comprise the elevationally outermost surface of a conductive material 22, for example conductively doped epitaxially grown silicon. Only the uppermost portion of conductive material 22, conductive material 14, and insulative sidewalls 18 are shown in FIGS. 2 and 3. Regardless, FIGS. 2 and 3 show but one example of an elevational location for node locations 20, and such might be located elsewhere. For example, the node locations may be elevationally much closer to the outermost surfaces of insulative caps 16 whether at the same elevation thereof, above, or below such outermost surfaces of caps 16. Likewise, the node locations may be elevationally much closer to the outermost surfaces of conductive material 14 whether at the same elevation thereof, above, or below such outermost surfaces of material 14. Further, node locations 20 may be at different respective elevations relative to one another as opposed to all being at a common elevation as shown in FIGS. 2 and 3.

In one embodiment, conductive line constructions 12 constitute field effect transistor gate lines in the form of access lines, for example word lines, of DRAM where such word lines are part of recessed access devices within bulk semiconductor material (not shown). Node locations 20 in such example constitute one of sense line contact locations (i.e., bit line contact locations) and capacitor storage node locations to which electrical connection is to be made. Further and regardless, conductive line constructions 12 may run straight, and may run parallel relative to one another, as shown. Alternately, such may run other than parallel relative to one another, and regardless may serpentine or undulate relative to one another having straight and/or curved portions.

A material 24 through which contact openings will be etched has been provided between conductive line constructions 12. Where material 24 remains as part of the finished circuitry construction, such comprises insulative material. Examples include silicon nitride, doped silicon dioxide such as phosphosilicate glass and borophosphosilicate glass, and undoped silicon dioxide for example deposited by decomposition of tetraethylorthosilicate or spin-on glass. Regardless, material 24 may or may not be homogenous. Material 24 may be formed, for example, by deposition followed by planarization back at least to elevationally outermost surfaces of insulative caps 16.

A hardmask material 28 may be received over gate constructions 12 and material 24. Such may or may not be homogenous, with example materials including novolac resins and amorphous carbon. An example thickness range for material 28 is from about 500 Angstroms to about 1 micron.

An inorganic antireflective coating 30 may be received over hardmask material 28. Example materials include Si—O—N-comprising materials. An example thickness range is from about 100 Angstroms to about 500 Angstroms. An organic antireflective coating 32 may be received over inorganic antireflective coating 30. Example materials include any commercially available BARC. An example thickness range for organic antireflective coating 32 is from about 100 Angstroms to about 600 Angstroms. Depending upon application and use, either or both of materials 30 and 32 may also provide a hard-masking function, and may collectively in combinations with material 28 also be considered as hardmask material.

Photoresist material 34 may be received over organic antireflective coating 32. Any existing or yet-to-be developed positive or negative photoresist may be used. In the context of this document, a "photoresist" is some material capable of being photo-patterned with incident radiation having a wavelength range of from 12 nanometers to 365 nanometers. By ways of example only, specific examples include 22 nanometer photoresist, 193 nanometer photoresist, 248 nanometer photoresist, and 365 nanometer photoresist. An example thickness range for photoresist 34 is from about 500 Angstroms to about 3,000 Angstroms. An alternate material 34 comprises amorphous carbon, for example as a hard mask, and independent of example materials 32, 30, and 28 being received there-beneath.

In one example embodiment, materials 28, 30, 32 and 34 collectively comprise a mask 23 received over a material to be etched, for example over material 24. In one embodiment, mask 23 comprises at least one of a) photoresist as defined above, and b) amorphous carbon. Photoresist or amorphous carbon may or may not be the outermost portion of the mask. Regardless, the mask does not require hard-masking material, and does not require one or more antireflective coating layers. Further, where an antireflective coating is used, materials 30 and 32 in combination may also be considered as an antireflective coating. Material 34 is shown with hatching in FIGS. 2 and 3, but not in the FIG. 1 top view for better clarity in FIG. 1.

Figure 4:
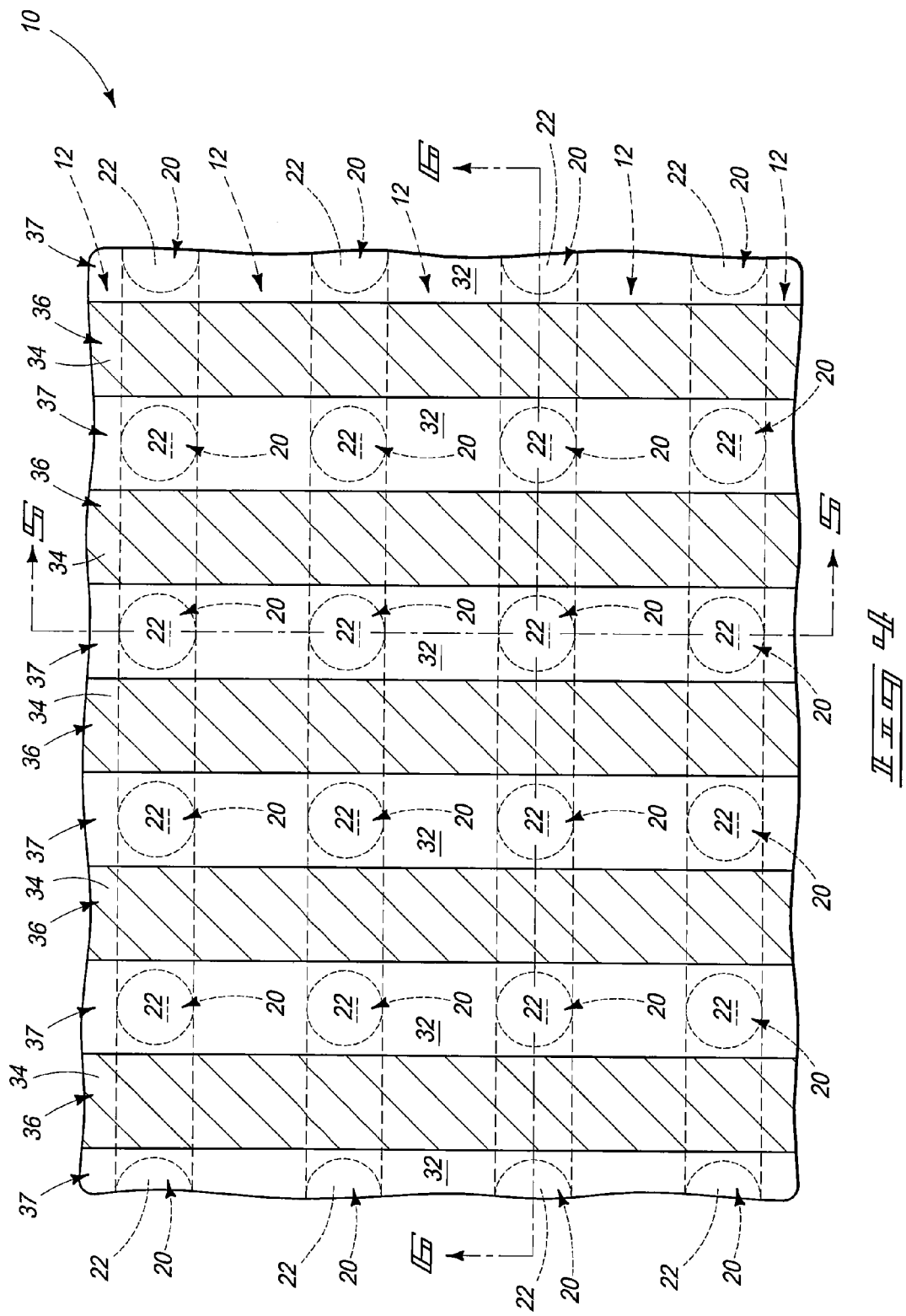
FIG. 4 is a diagrammatic top plan view of the FIG. 1 substrate at a processing step subsequent to that shown by FIG. 1.
Figure 5:
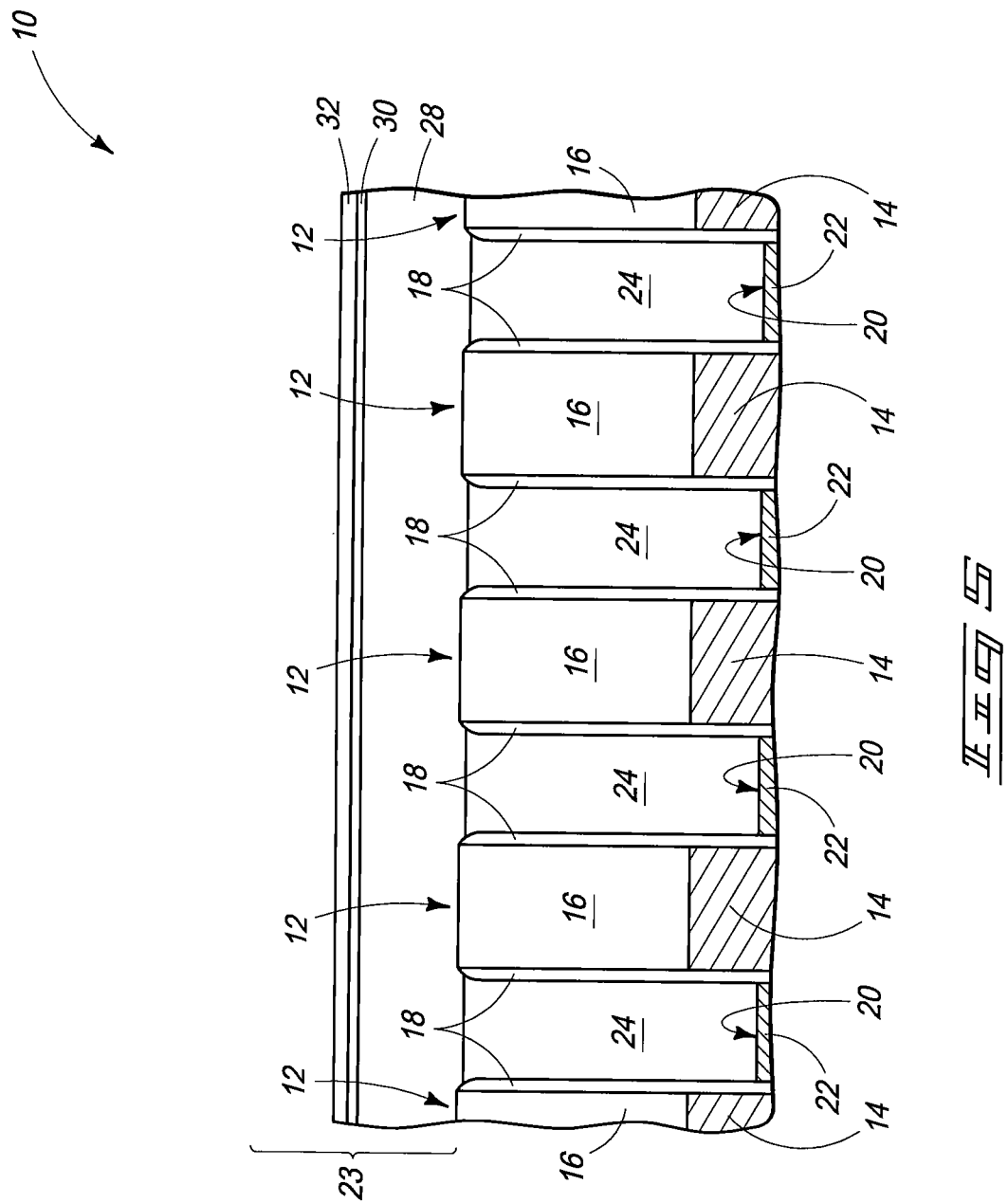
FIG. 5 is a sectional view of taken through line 5-5 in FIG. 4.
Figure 6:
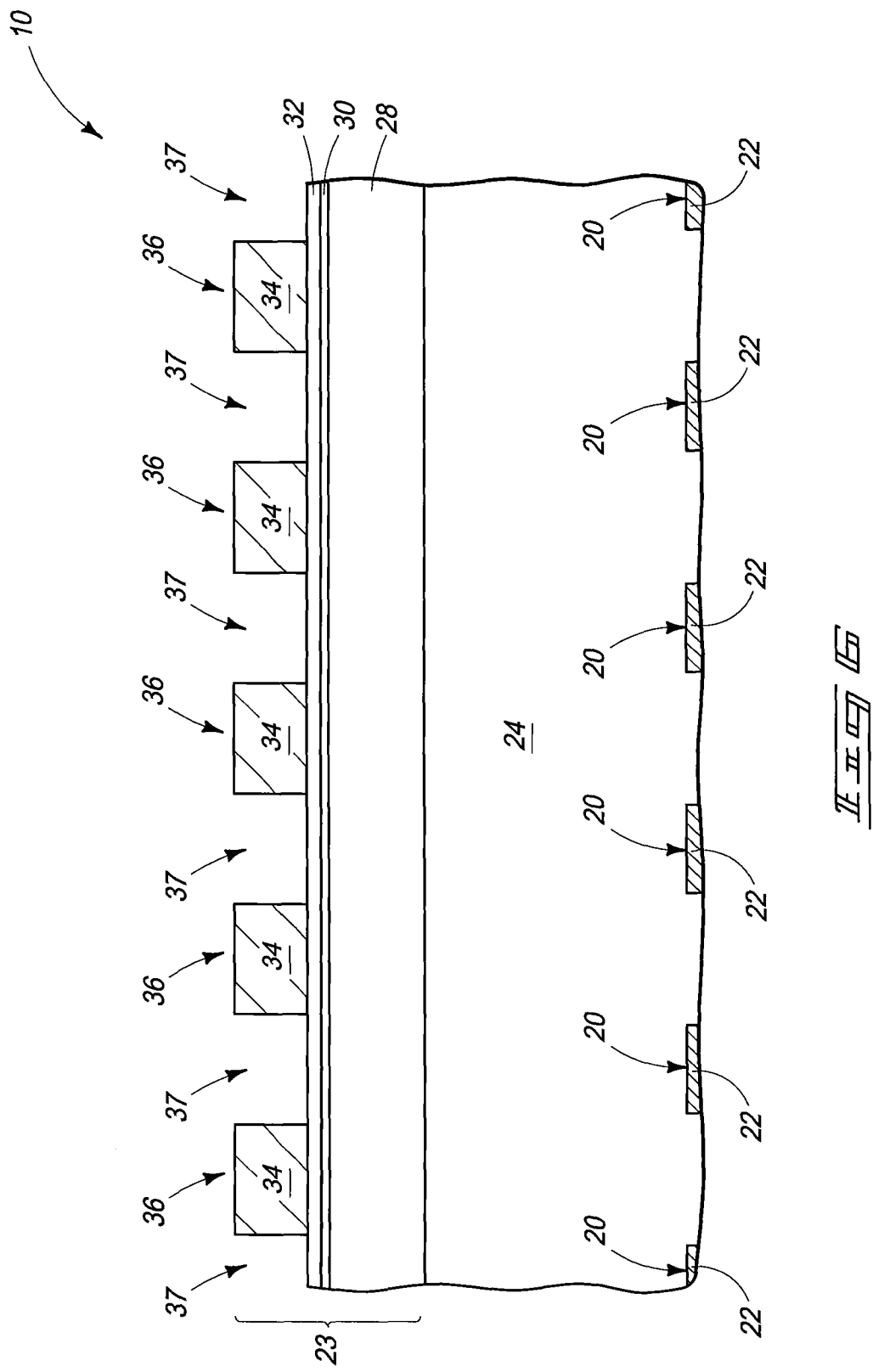
FIG. 6 is a sectional view of taken through line 6-6 in FIG. 4.

Referring to FIGS. 4-6, photoresist and/or amorphous carbon material 34 has been patterned to form mask 23 to comprise a plurality of spaced lines 36 and trench spaces 37 between immediately adjacent of spaced lines 36. Spaced lines 36 and trench spaces 37 angle relative to conductive line constructions 12, as opposed to being parallel or coincident therewith. In one embodiment and as shown, such angle generally orthogonally/perpendicularly relative to conductive line constructions 12. Regardless, trench spaces 37 are received over node locations 20. Lines 36, and correspondingly complimentary spaces 37, may run parallel relative to one another and may be straight relative to one another. Alternately, such may undulate or serpentine relative one another, and/or include both straight and curved portions. Regardless, spaced lines 36 and trench spaces 37 may be formed by any existing or yet-to-be developed manner. For example where material 34 is photoresist, such may be patterned using photolithography with a mask/reticle and a selected incident radiation wavelength to which the photoresist is photoactive. Alternate techniques to form spaced lines 36 and trench spaces 37 might be used even if material 34 is photoresist. If material 34 comprises amorphous carbon, a patterned photoresist or other layer (not shown) might be received over material 34 and used as an etch mask to form trench spaces 37 in material 34.

Figure 7:
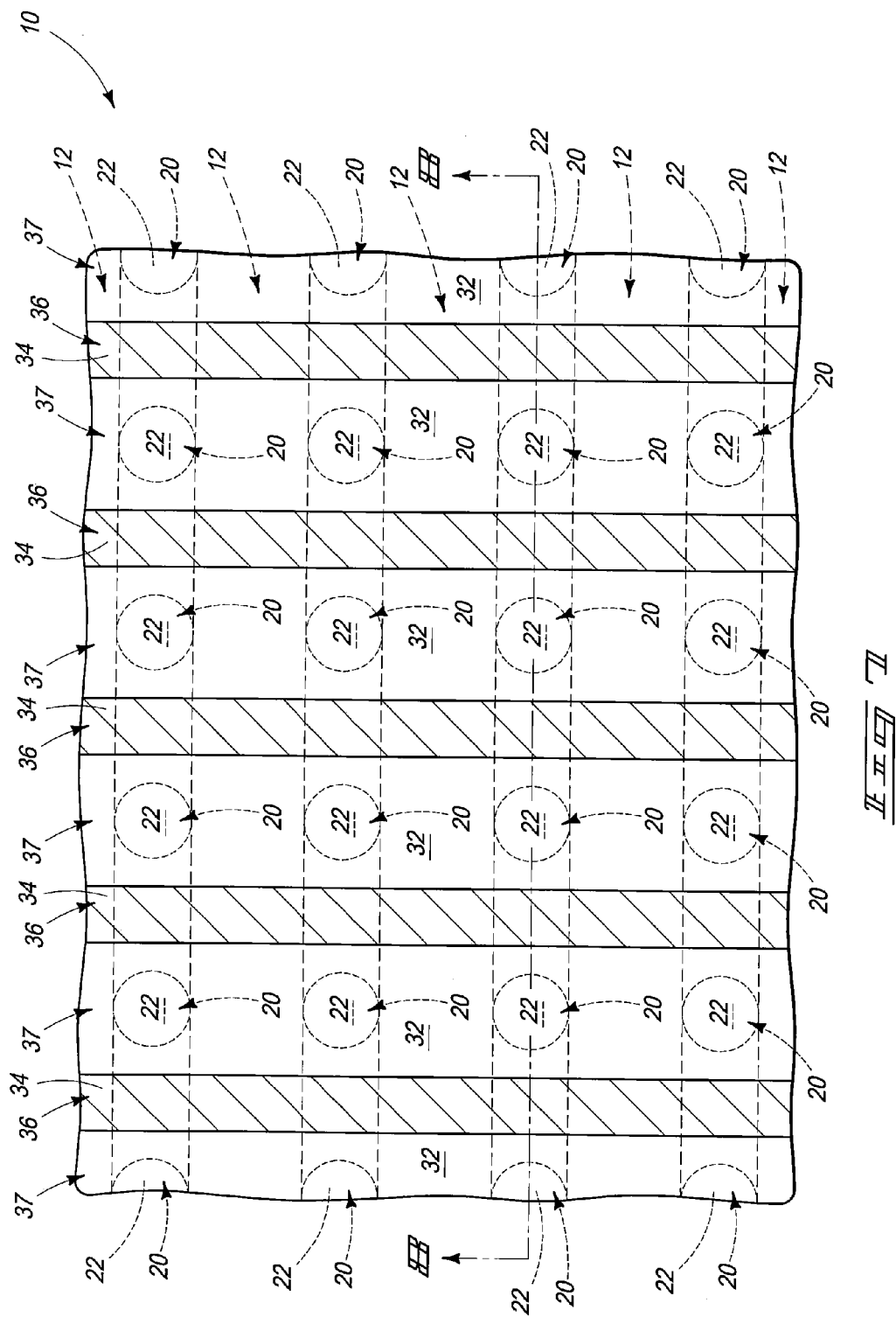
FIG. 7 is a diagrammatic top plan view of the FIG. 4 substrate at a processing step subsequent to that shown by FIG. 4.
Figure 8:
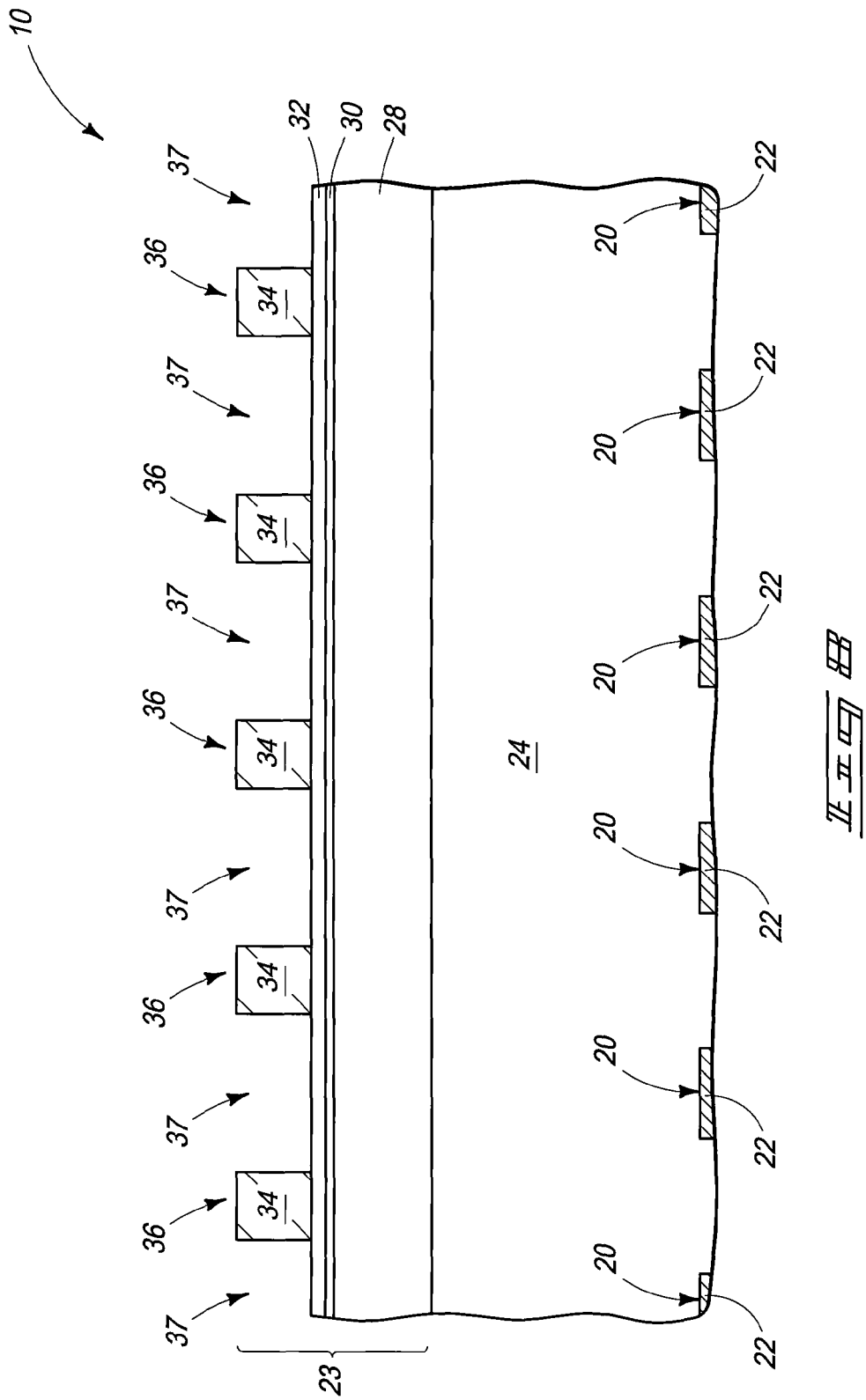
FIG. 8 is a sectional view of taken through line 8-8 in FIG. 7.

Referring to FIGS. 7 and 8, material 34 comprising at least one of photoresist and amorphous carbon has been treated with a plasma to reduce the lateral width of spaced lines 36 and to increase the lateral width of trench spaces 37. Ideally, the treating is conducted to be self-limiting to the reducing of lateral width of the spaced lines and to the increasing of the lateral width of the trench spaces, and in one embodiment as shown is along opposing directions which are parallel to conductive line constructions 12. With respect to the meaning of "self-limiting", continued exposure to plasma of the FIGS. 7 and 8 construction is self-limiting in that negligible or no further reduction occurs of the lateral width of spaced lines 36 or increase of the lateral width of trench spaces 37.

Any suitable plasma may be utilized for such treating. In one embodiment, the plasma is ideally chemically inert to the at least one of photoresist and amorphous carbon being treated, with the treating thereby essentially being entirely physical removal. In one embodiment, the trench spaces may be considered as having bases which are of a material other than photoresist and amorphous carbon. For example in the depicted embodiment, the bases of trench spaces 37 constitute material 32 which may be other than photoresist or amorphous carbon. In one embodiment, the plasma is chemically inert to the material of the bases of the trench spaces.

As examples, any one or combination of two or more of Ar, He, Ne, Kr, and Xe may be used as a plasma-generating gas and which is essentially chemically inert to material to which such is exposed. Alternately, the plasma may comprise chemically inert components and chemically reactive components to the at least one of photoresist and amorphous carbon, with the reducing of lateral width of the spaced lines occurring by greater physical removal than by chemical removal. For example, the treating plasma may comprise a chemically reactive species with respect to material 34 and/or material immediately underlying material 34. As examples, any of HBr, $SiCl_4$, $C_xF_y$, or $C_xH_yF_z$ may be used in addition to chemically inert components, where for example the physical removal effects of the plasma to material 34 is greater than any chemical removal effect to either material 34 or material immediately underlying material 34.

Regardless, any example suitable plasma generating system may be used. An inductively coupled plasma reactor is but one example system. In an inductively coupled plasma reactor, an example top power range is from 50 watts to 500 watts, and an example bottom power range to the electrostatic chuck is from 0 volts to 500 volts. An example pressure range within the chamber during plasma generation and exposure is from 2 mTorr to 100 mTorr. An example temperature range of the substrate during processing is from 10° C. to 70° C. An example range for the total flow of gas is from 50 sccm to 1,000 sccm for a chamber having a volume from about six liters to sixty liters, with from 100-500 sccm being a narrower example range. An example range of time for the treating is anywhere from 30 seconds to 2 minutes. Operating within the above example ranges may achieve one or more self-limiting aspects as identified above. Operating outside of one or more of the ranges is also contemplated.

Figure 9:
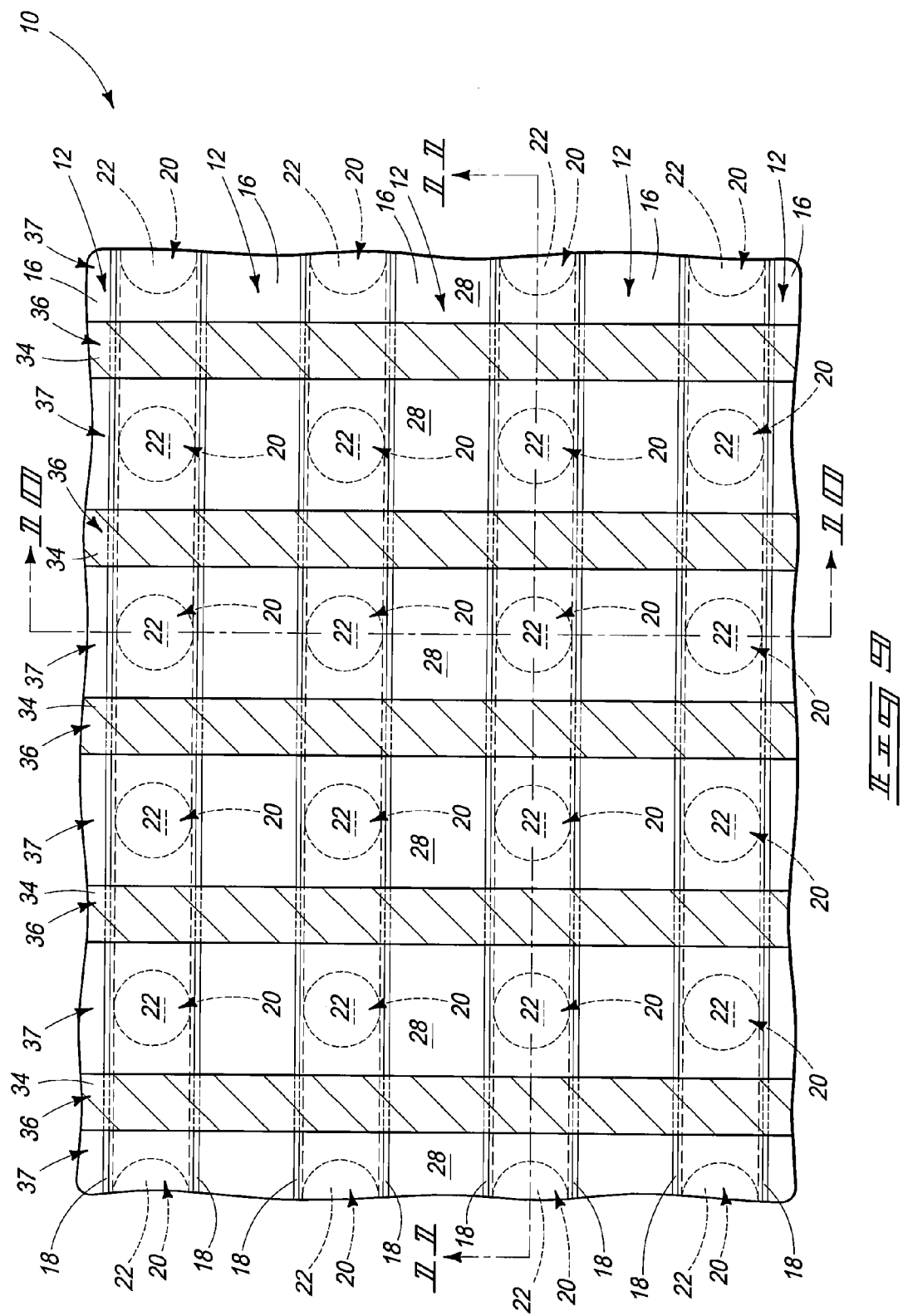
FIG. 9 is a diagrammatic top plan view of the FIG. 7 substrate at a processing step subsequent to that shown by FIG. 7.
Figure 10:
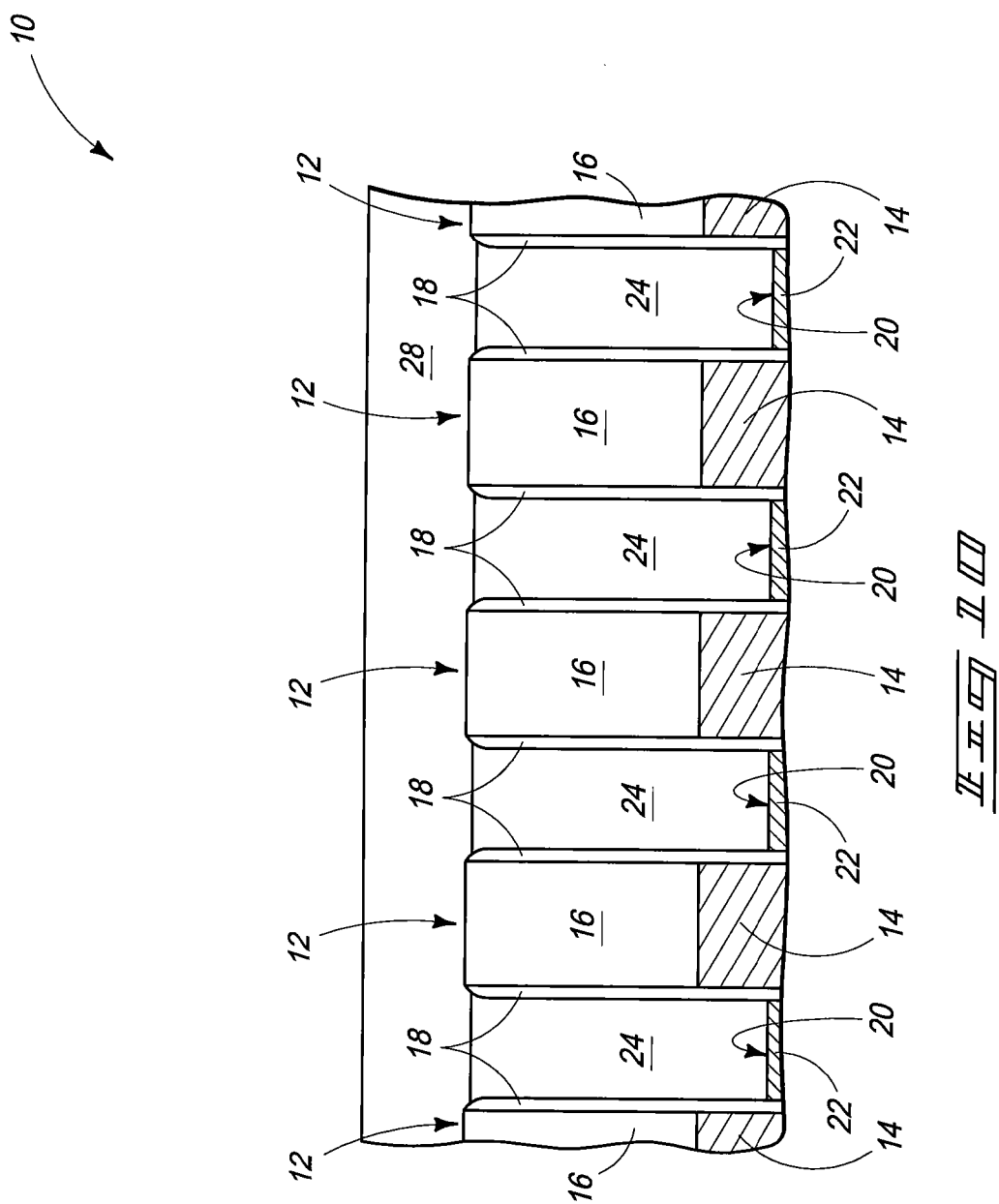
FIG. 10 is a sectional view of taken through line 10-10 in FIG. 9.
Figure 11:
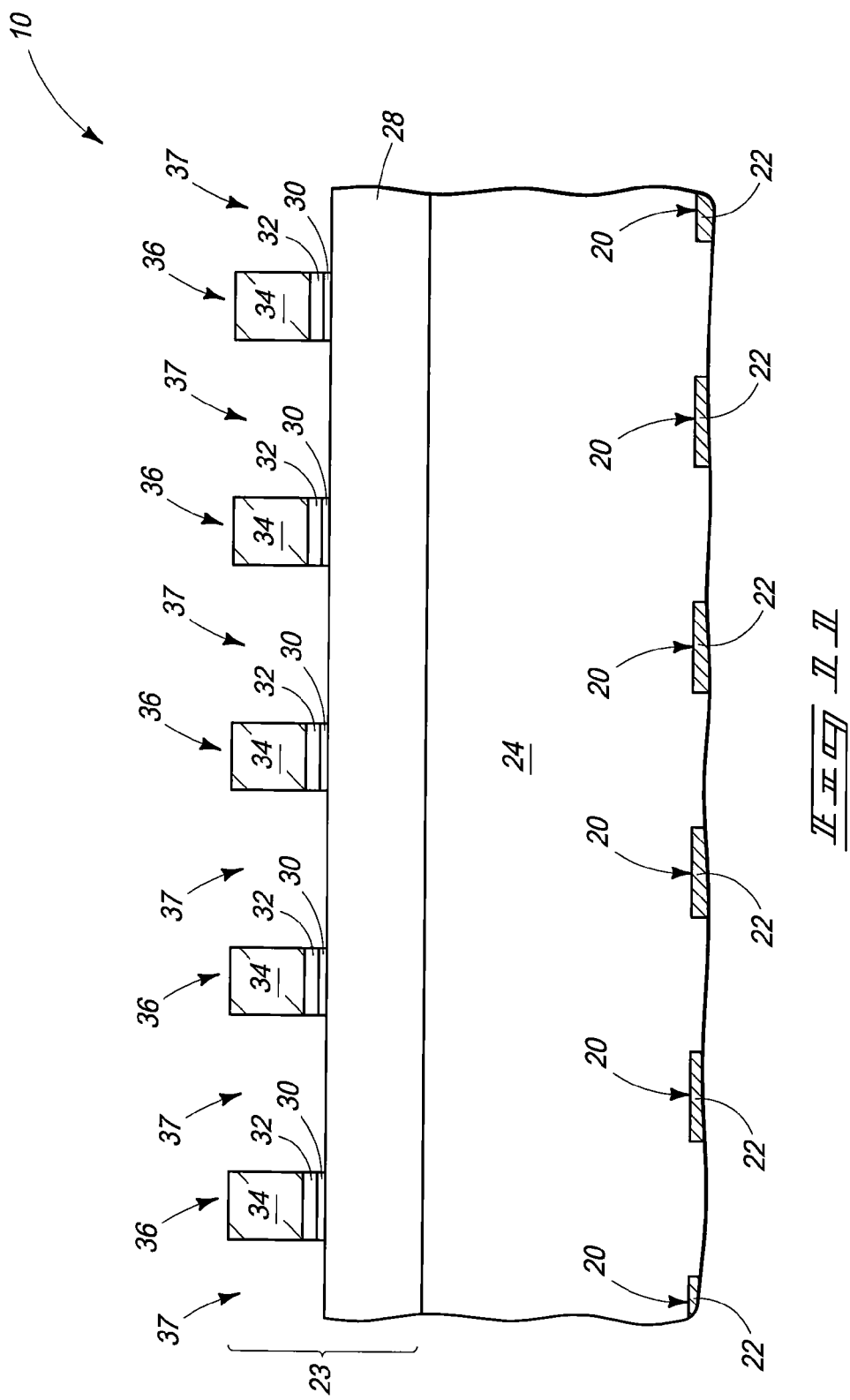
FIG. 11 is a sectional view of taken through line 11-11 in FIG. 9.

Referring to FIGS. 9-11, organic antireflective coating 32 and inorganic reflective coating 30 have been etched to extend trench spaces 37 to hardmask material 28. By ways of example only, a suitable anisotropic etching chemistry for etching material 32 includes a combination of $SO_2$ and $O_2$, while a suitable anisotropic etching chemistry for etching material 30 includes $CF_4$ and HBr.

Figure 12:
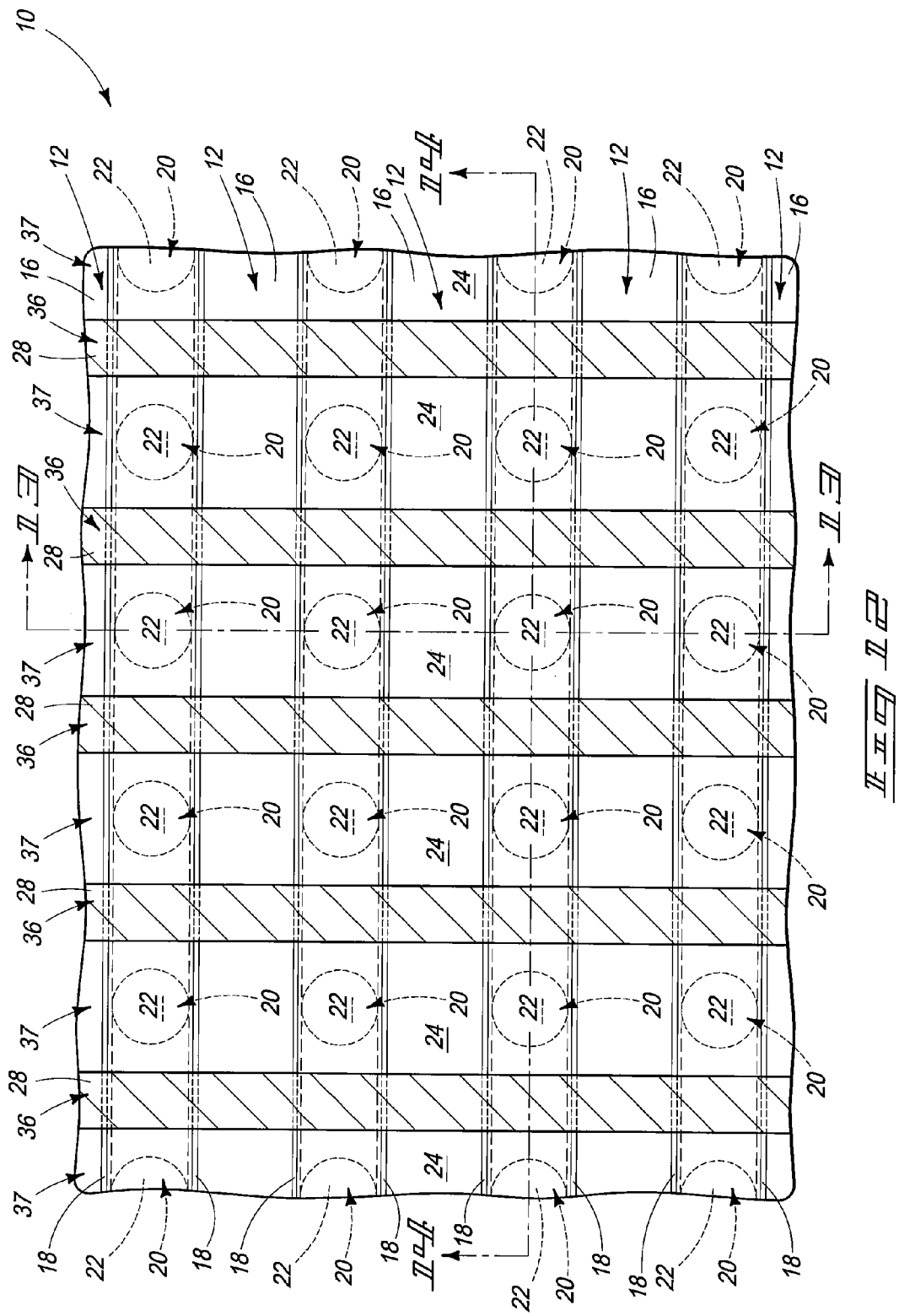
FIG. 12 is a diagrammatic top plan view of the FIG. 9 substrate at a processing step subsequent to that shown by FIG. 9.
Figure 13:
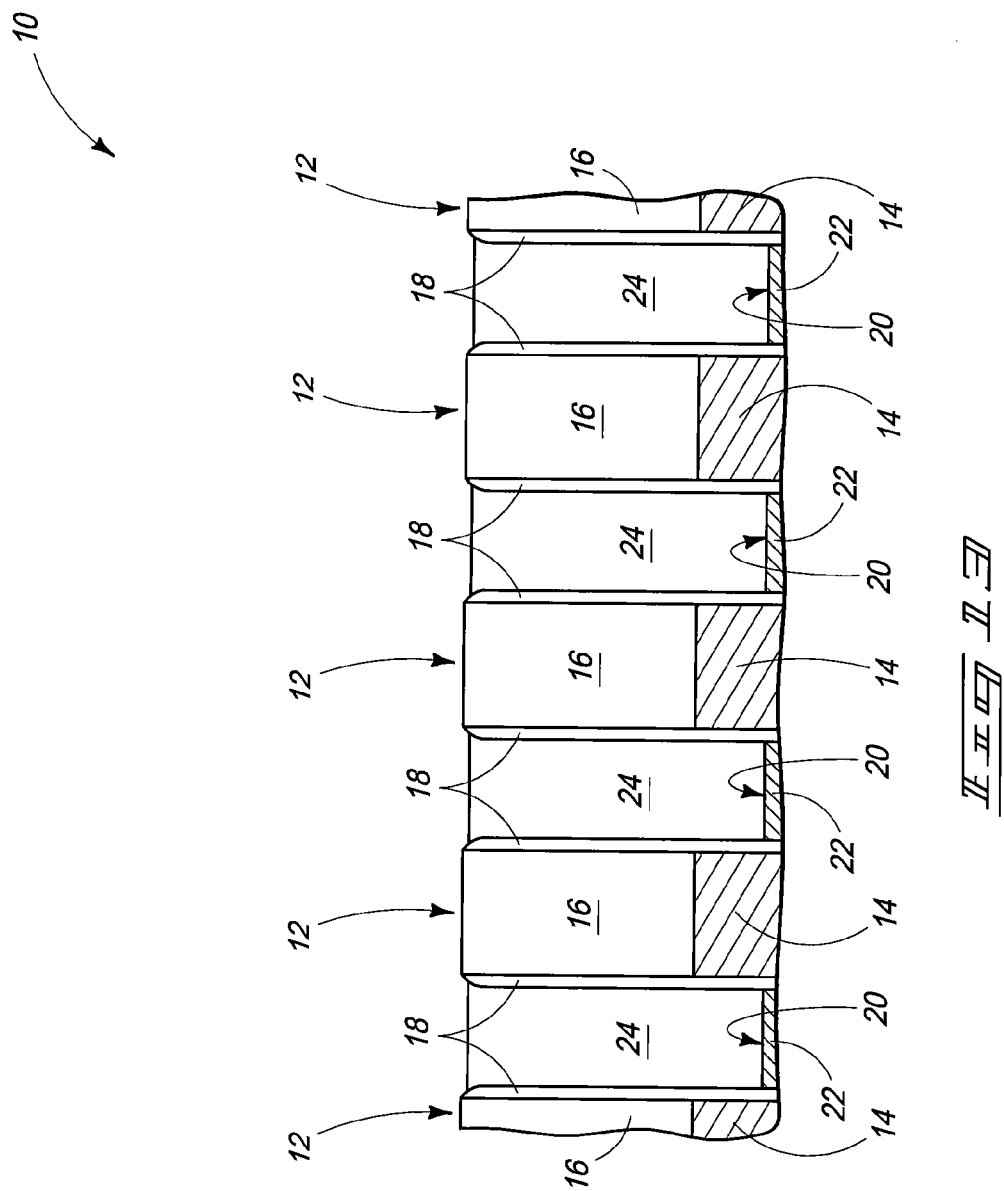
FIG. 13 is a sectional view of taken through line 13-13 in FIG. 12.
Figure 14:
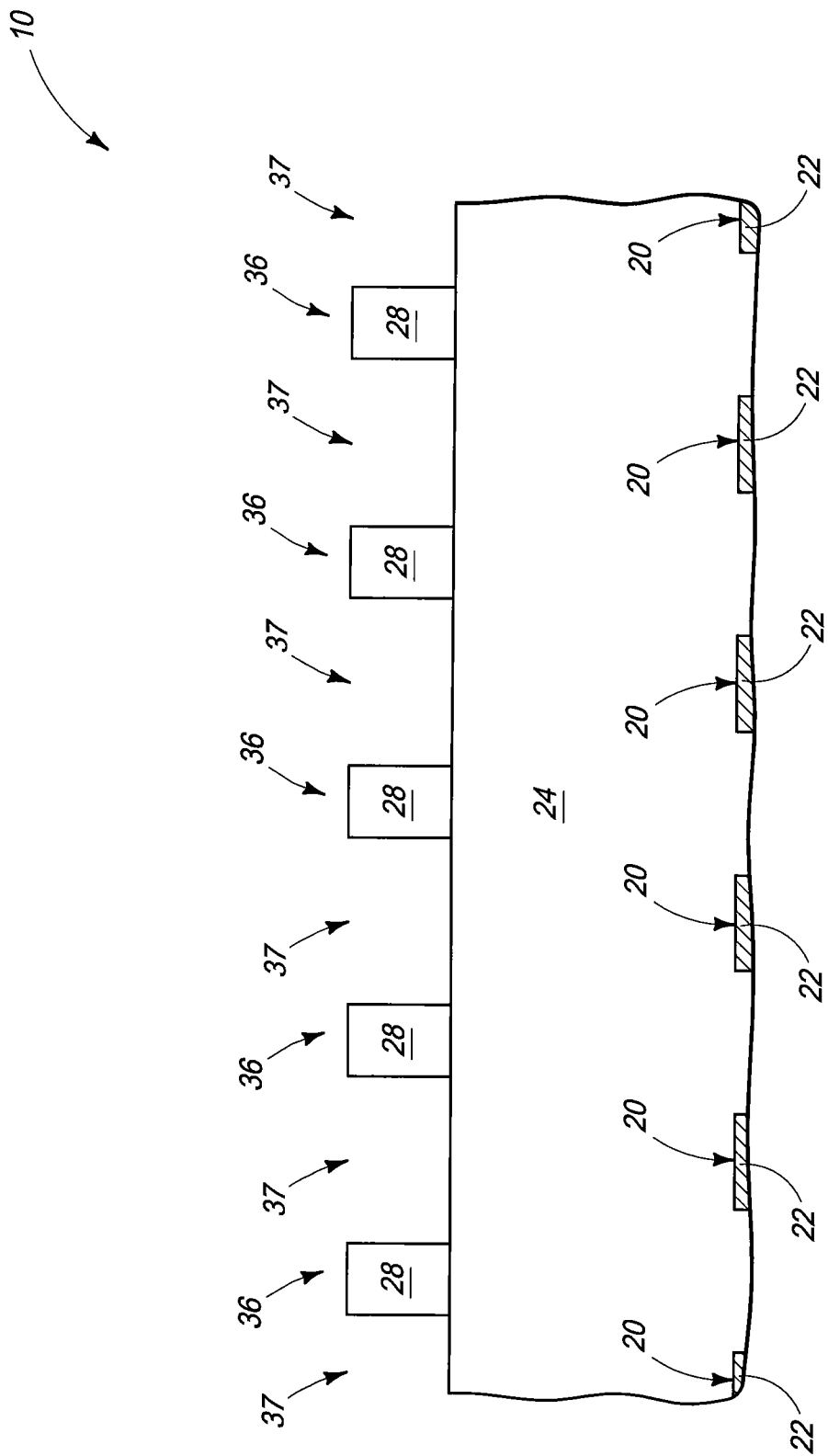
FIG. 14 is a sectional view of taken through line 14-14 in FIG. 12.

Referring to FIGS. 12-14, the mask of materials 34, 32, 30 (not shown) of FIGS. 9-11 has been transferred to underlying hardmask material 28. In such process, for example by etching, some or none of remaining materials 34, 32, 30 may be etched. Alternately or additionally, such materials might be removed subsequently such that none of such is any longer received over material 28, for example as shown in FIGS. 12-14.

Figure 15:
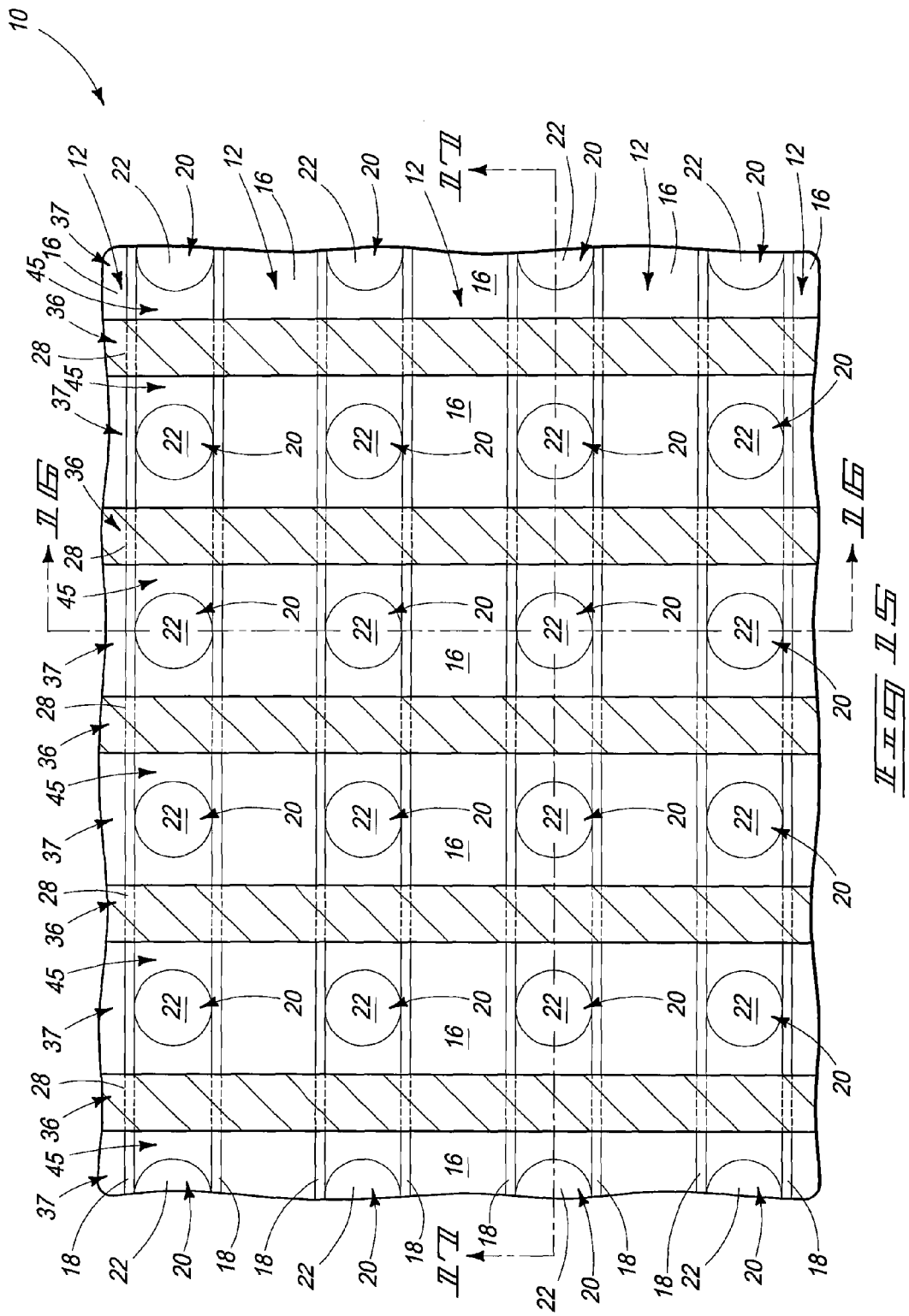
FIG. 15 is a diagrammatic top plan view of the FIG. 12 substrate at a processing step subsequent to that shown by FIG. 12.
Figure 16:
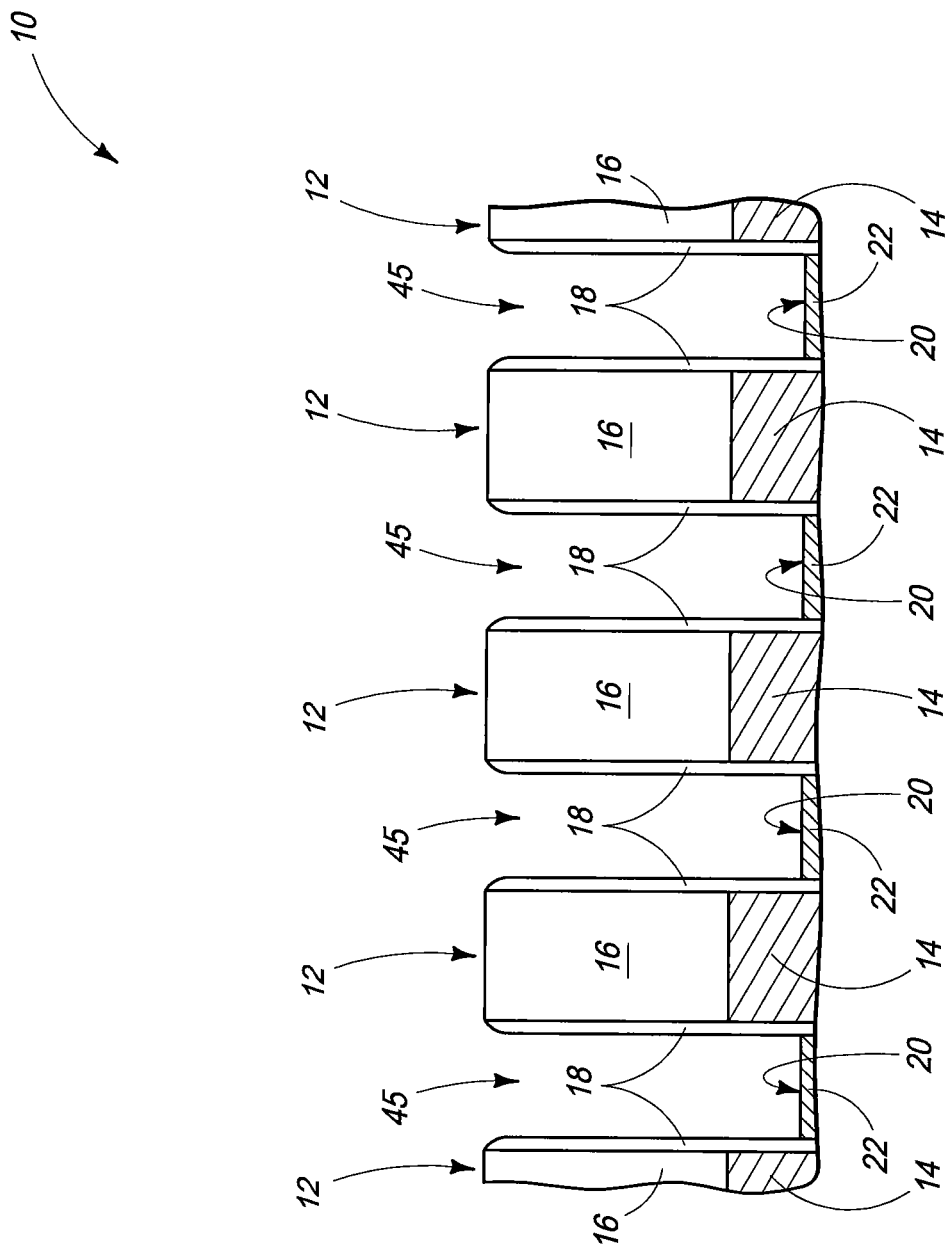
FIG. 16 is a sectional view of taken through line 16-16 in FIG. 15.
Figure 17:
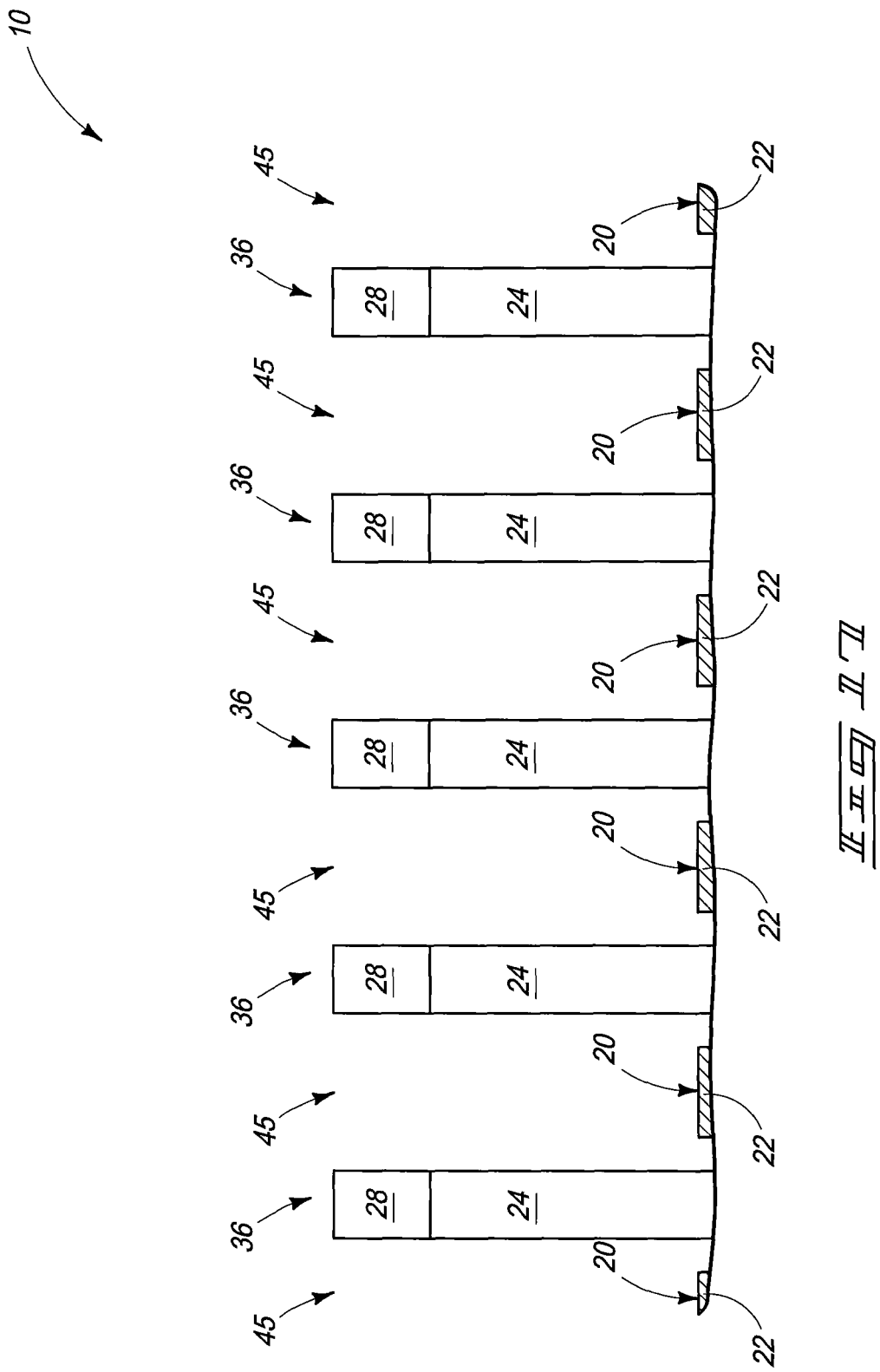
FIG. 17 is a sectional view of taken through line 17-17 in FIG. 15.

Referring to FIGS. 15-17, contact openings 45 have been etched through material 24 to node locations 20 selectively relative to insulative caps 16 and insulative sidewalls 18. In the context of this document, a "selective" etch requires removal of one material relative to another material at a rate of at least 1.5:1. Where, for example, material 24 comprises borophosphosilicate glass and materials 16 and 18 comprise silicon nitride, an example anisotropic etching chemistry which will achieve a selective etch such as shown in FIGS. 15-17 includes $C_xF_y$, where x/y is less than 2. (Material 28 is shown with hatching in FIGS. 12 and 15 for better clarity in such figures, but is not so shown in FIGS. 14 and 17).

Figure 18:
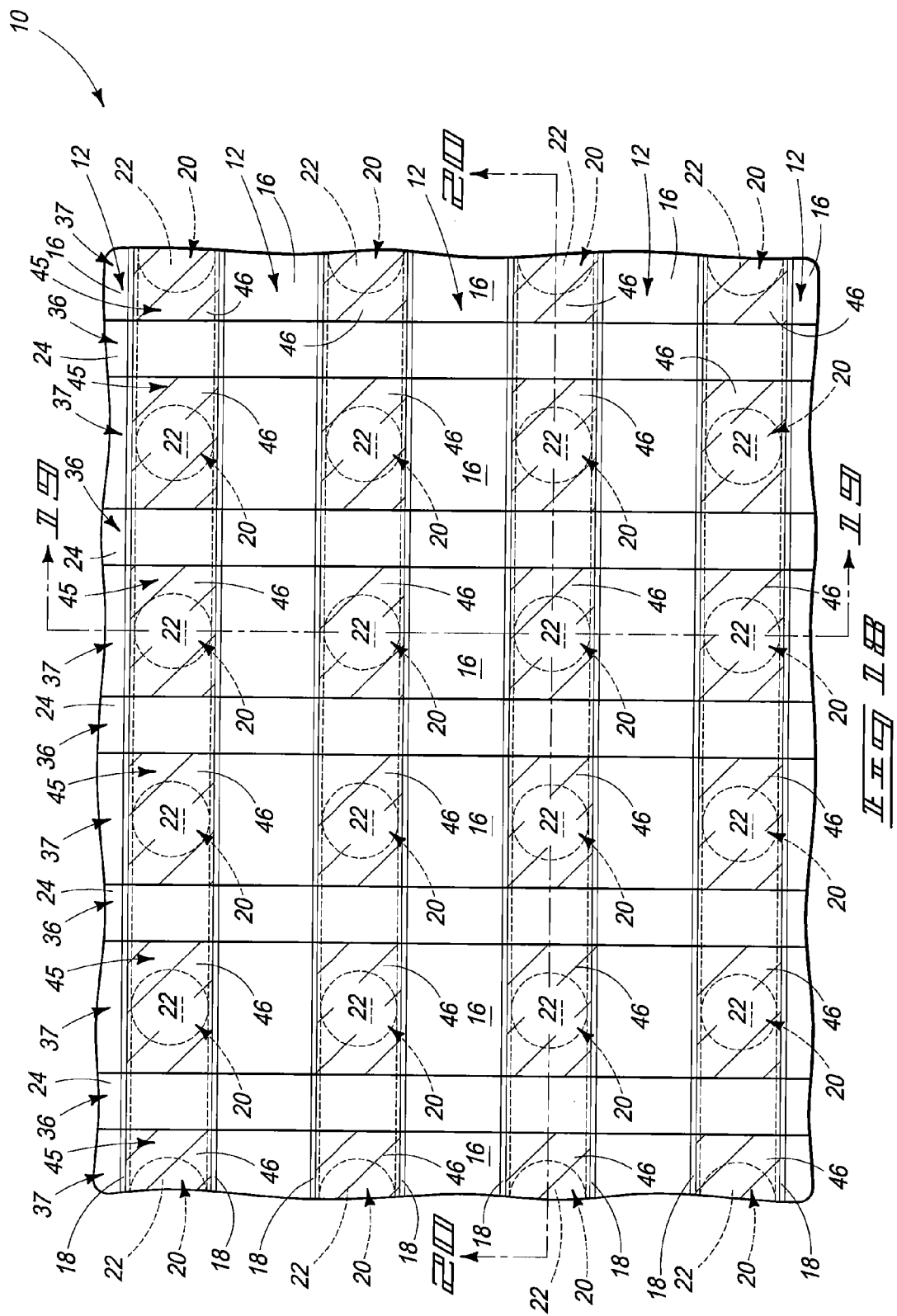
FIG. 18 is a diagrammatic top plan view of the FIG. 15 substrate at a processing step subsequent to that shown by FIG. 15.
Figure 19:
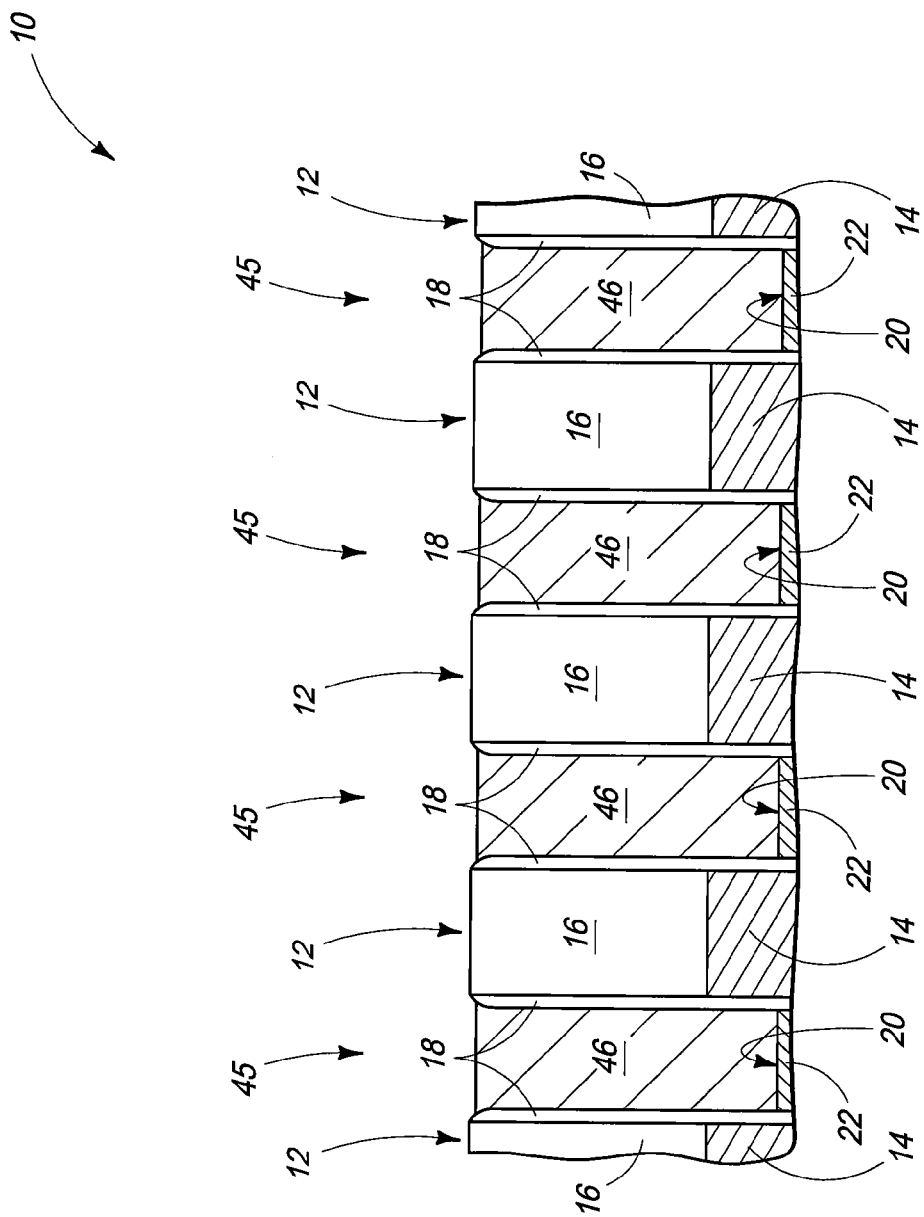
FIG. 19 is a sectional view of taken through line 19-19 in FIG. 18.
Figure 20:
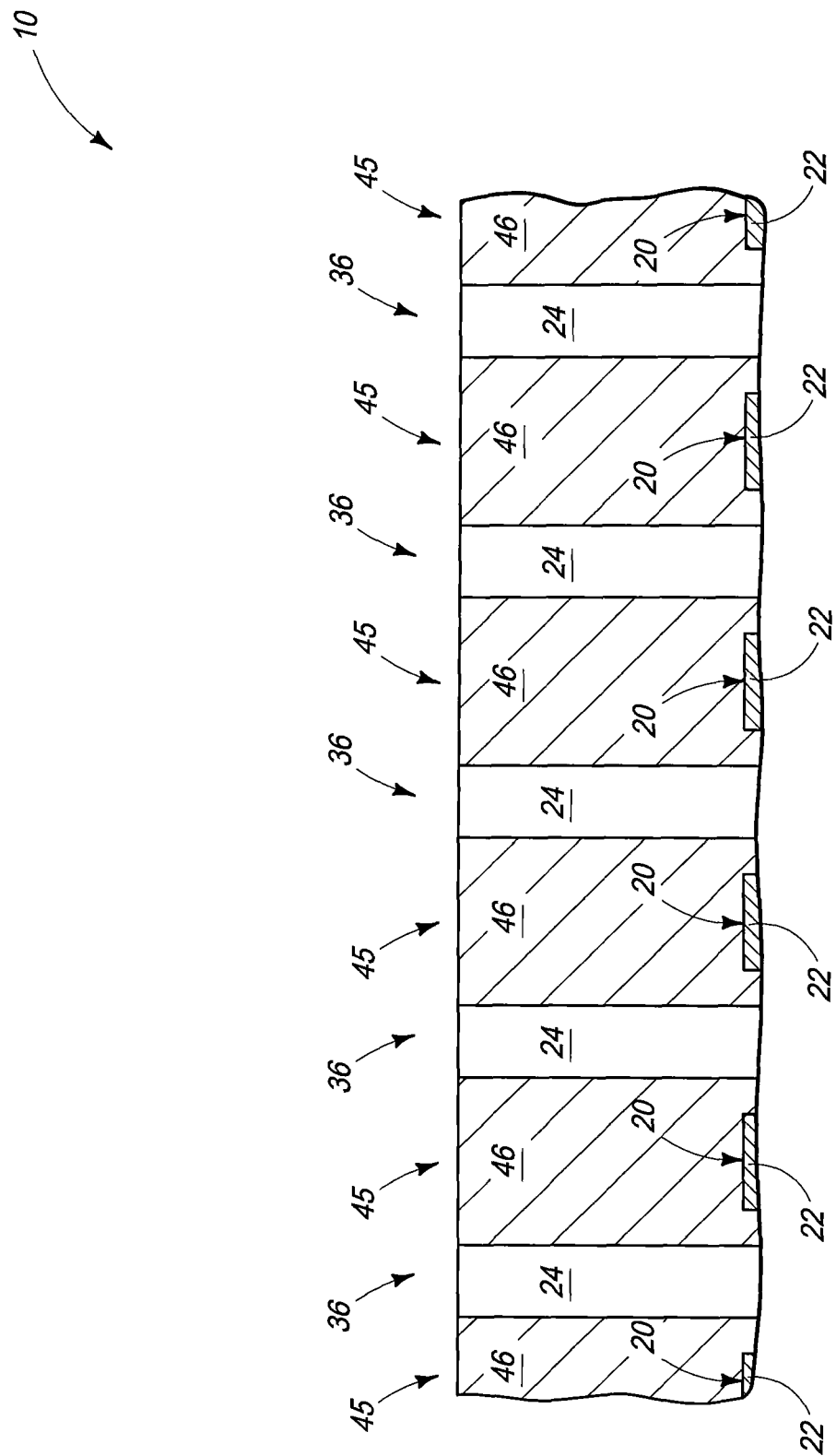
FIG. 20 is a sectional view of taken through line 20-20 in FIG. 18.

Referring to FIGS. 18-20, conductive material 46 has been formed to within contact openings 45 and in electrical connection with node locations 20. Such may be formed by deposition of one or more conductive materials followed by planarization back at least to elevationally outermost surfaces of insulative cap 16. Hardmask material 28 (not shown) may be wholly or partially removed before or during such planarization, or not at all. Hardmask material 28 may be separately removed by a dry strip and/or wet process.

In one embodiment, the aspect ratios of contact openings 45 have been reduced over what they would have been were the plasma treating not conducted. In one embodiment, the areas for making contact to material 46 has effectively been increased over what it would have been were the plasma treating not conducted.

The spaced lines 36 of FIGS. 4 and 6 may or may not individually be of a constant lateral width, with a constant lateral width being shown in those and subsequent figures. In one embodiment, the spaced lines are individually of a constant lateral width along at least a majority of their length immediately prior to the treating with plasma. In one embodiment and as shown in FIGS. 4 and 6, the plurality of spaced lines 36 are of the same constant lateral width along at least a majority of their length immediately prior to the treating with plasma.

Figure 21:
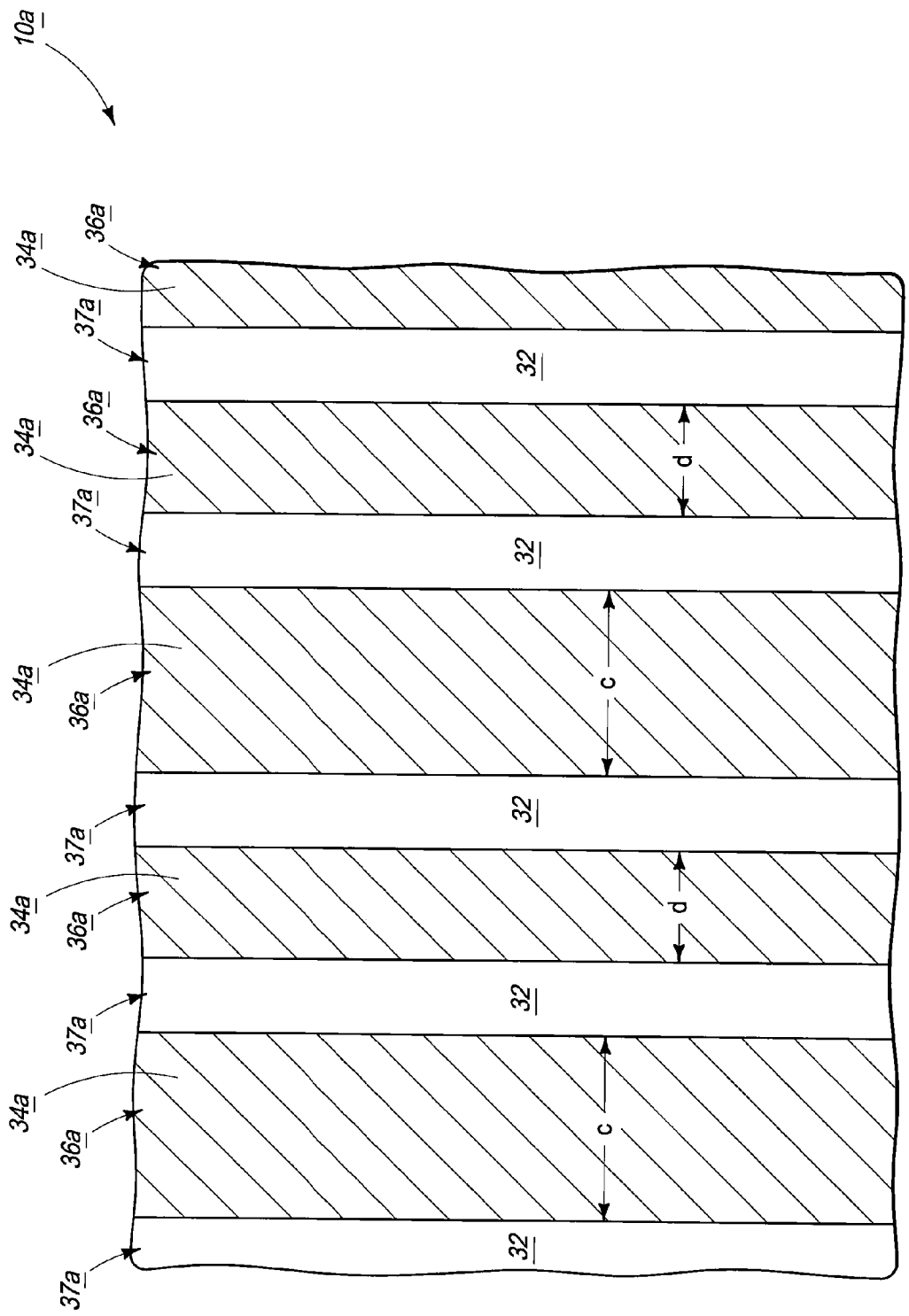
FIG. 21 is a diagrammatic top plan view of a substrate in process in accordance with an embodiment of the invention.

An alternate embodiment is next described with reference to FIGS. 21 and 22 with respect to a substrate 10a wherein such constant lateral width is of at least two different values for different of the spaced lines among the plurality of the spaced lines immediately prior to the treating with plasma. Like numerals from the FIGS. 1-20 embodiments have been used where appropriate, with differences being indicated with the suffix "a". In FIGS. 21 and 22, only spaced lines 36a, complimentary spaces 37a, and underlying layer 32 are shown for clarity in the figures. Substrate construction therebelow, including the placement of the node locations, may be the same or different as that described in the FIGS. 1-20 embodiments. As in the above-described embodiments, and in but one example, spaced lines 36a are individually of a constant lateral width along at least a majority of their length. However, such constant lateral width is of at least two different values for different of spaced lines 36a among the plurality of spaced lines, for example a value "c" and a different value "d". FIG. 21 depicts an example wherein only two different values "c" and "d" are used, and where lines 36a of width "c" alternate with those of "d". Alternate arrangements, and using more than two different values, are also contemplated.

In one embodiment, the widest of the spaced lines is more than 50% wider than the value of the narrowest of the spaced lines prior to the plasma treating. For example, an example dimension "c" is 140 nanometers while an example dimension d is 80 nanometers, whereby "c" is more than 40 nanometers (50%) wider than the 80 nanometer "d" value.

Referring to FIG. 22, the at least one of photoresist and amorphous carbon material 34a has been treated with a plasma to reduce said constant lateral width of the wider of spaced lines 36a by a larger amount than any reducing of the constant lateral width of narrower of spaced lines 36a. In one embodiment and as shown, the plasma treating reduces such constant lateral width of the narrower of spaced lines 36a as well as that of the wider of spaced lines 36a. In one embodiment, the plasma treating is conducted to be self-limiting to the reducing of the constant lateral widths of all of the spaced lines. In one embodiment, the plasma treating reduces such constant lateral widths of wider of the spaced lines to be within 10% of such constant lateral widths of narrower of the spaced lines after such plasma treating. For example and by way of example only where the wider or widest lines are 140 nanometers in lateral width and the narrower or narrowest lines are 80 nanometers in lateral width, the plasma treating may reduce such constant lateral widths to from about 30 nanometers to about 20 nanometers. Regardless, plasma treating may be the same as described above with respect to the embodiments of FIGS. 7-9.

After such plasma treating, contact openings would be etched through underlying material to node locations selectively relative to the insulative caps and the insulative sidewalls of the conductive line constructions, for example as shown and described above with respect to FIGS. 15-17. Such contact openings may be subsequently filled with conductive material.

An embodiment of the invention encompasses a method of increasing conductive plug contact area in only one of X and Y axes in the fabrication of integrated circuitry. Specifically, a plurality of conductive line constructions are formed which are oriented along one of X and Y axes, with the conductive line constructions comprising insulative caps and insulative sidewalls. By way of example only, line constructions 12 of FIG. 1 may be considered as being oriented along either an X or Y axis.

A mask is formed which comprises a plurality of spaced lines and trench spaces between adjacent of the spaced lines over, and which run orthogonally relative to, the conductive line constructions in the other of the X and Y axes. For example, FIGS. 4-6 and FIG. 21 depict example such embodiments. The trench spaces are received over node locations received between adjacent of the conductive line constructions.

Lateral width of the spaced lines is reduced in a direction parallel to the conductive lines which is along the one of the X and Y axes. The spaced lines of reduced lateral width are used as masking in one or more etchings of contact openings through insulative material to the node locations in a self-aligning manner relative to the insulative caps and the insulative sidewalls of the conductive line constructions. Any of the embodiments as described above may be used. In one embodiment, multiple of such etchings are conducted wherein a former of such etchings forms a hardmask in a hard-masking material and a latter of such etchings is into insulative material below the hard-masking material, wherein the hardmask is used as masking. In one embodiment, the spaced lines whose widths are reduced consist essentially of photoresist, and in another embodiment consist essentially of amorphous carbon.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming contact openings in the fabrication of integrated circuitry, comprising:
   forming a mask comprising at least one of photoresist and amorphous carbon over a plurality of spaced conductive line constructions, the conductive line constructions comprising insulative caps and insulative sidewalls, the mask comprising a plurality of spaced lines and trench spaces between adjacent of the spaced lines, the spaced lines and the trench spaces angling relative to the conductive line constructions, the trench spaces being received over node locations received between adjacent of the conductive line constructions;
   treating the at least one of photoresist and amorphous carbon with a plasma to reduce lateral width of the spaced lines and to increase lateral width of the trench spaces, the plasma comprising chemically inert and chemically reactive components to said at least one of photoresist and amorphous carbon, the reducing of lateral width of the spaced lines occurring by greater physical removal than by chemical removal of said at least one of photoresist and amorphous carbon; and
   after the treating, etching contact openings to the node locations selectively relative to the insulative caps and the insulative sidewalls.

2. The method of claim 1 wherein the treating is conducted to be self-limiting to the reducing of the lateral width of the spaced lines and to the increasing of the lateral width of the trench spaces.

3. The method of claim 1 wherein the treating is conducted to be self-limiting to the reducing of the lateral width of the spaced lines and to the increasing of the lateral width of the trench spaces along opposing directions parallel the conductive line constructions.

4. The method of claim 1 wherein the mask comprises photoresist and the treating is of the photoresist.

5. The method of claim 1 wherein the mask comprises amorphous carbon and the treating is of the amorphous carbon.

6. The method of claim 1 wherein the spaced lines are individually of a constant lateral width along at least a majority of their length immediately prior to the treating, the plurality of spaced lines being of the same constant lateral width along at least a majority of their length immediately prior to the treating.

7. The method of claim 1 wherein the spaced lines are individually of a constant lateral width along at least a majority of their length immediately prior to the treating, said constant lateral width being of at least two different values for different of the spaced lines among the plurality of spaced lines immediately prior to the treating.

8. The method of claim 1 wherein the trench spaces have bases which are of a material other than photoresist and amorphous carbon, the plasma being chemically inert to said material of the bases of the trench spaces.

9. The method of claim 1 comprising generating the plasma from any one of, or any combination of two or more of, Ar, He, Ne, Kr, and Xe.

10. A method of forming contact openings in the fabrication of integrated circuitry, comprising:
    forming a mask comprising at least one of photoresist and amorphous carbon over a plurality of spaced conductive line constructions, the conductive line constructions comprising insulative caps and insulative sidewalls, the mask comprising a plurality of spaced lines and trench spaces between adjacent of the spaced lines, the spaced lines and the trench spaces angling relative to the conductive line constructions, the spaced lines individually being of a constant lateral width along at least a majority of their length, said constant lateral width being of at least two different values for different of the spaced lines among the plurality of spaced lines, the trench spaces being received over node locations received between adjacent of the conductive line constructions;
    treating the at least one of photoresist and amorphous carbon with a plasma to reduce said constant lateral width of wider of the spaced lines by a larger amount than any reducing of said constant lateral width of narrower of the spaced lines; and after the treating, etching contact openings to the node locations selectively relative to the insulative caps and the insulative sidewalls.

11. The method of claim 10 wherein the treating reduces said constant lateral width of the narrower of the spaced lines, the treating being conducted to be self-limiting to the reducing of said constant lateral widths of all of the spaced lines.

12. The method of claim 10 wherein the treating reduces said constant lateral width of the narrower of the spaced lines, the treating reducing said constant lateral width of wider of the spaced lines to be within 10% of said constant lateral width of narrower of the spaced lines after the treating.

13. The method of claim 12 wherein the treating is conducted to be self-limiting to the reducing of said constant lateral widths of all of the spaced lines.

14. The method of claim 10 wherein widest of the spaced lines are more than 50% wider than the value of the narrowest of the spaced lines before the treating, the treating reducing said constant lateral width of the narrowest of the spaced lines, the treating reducing said constant lateral width of widest of the spaced lines to be within 10% of said constant lateral width of narrowest of the spaced lines after the treating.

15. The method of claim 14 wherein the treating is conducted to be self-limiting to the reducing of said constant lateral widths of all of the spaced lines.

16. The method of claim 14 wherein the treating reduces said constant lateral width of widest of the spaced lines to be within 5% of said constant lateral width of narrowest of the spaced lines after the treating.

17. A method of increasing conductive plug contact area in only one of X and Y axes in the fabrication of integrated circuitry, comprising:

forming a plurality of conductive line constructions oriented along one of X and Y axes, the conductive line constructions comprising insulative caps and insulative sidewalls;

forming a mask comprising a plurality of spaced lines and trench spaces between adjacent of the spaced lines over and which run orthogonally relative to the conductive line constructions in the other of the X and Y axes, the trench spaces being received over node locations received between adjacent of the conductive line constructions;

reducing lateral width of the spaced lines in a direction parallel to the conductive line constructions which is along the one of X and Y axes by treating the spaced lines with a plasma, the plasma comprising chemically inert and chemically reactive components to said spaced lines, the reducing of lateral width of the spaced lines occurring by greater physical removal than by chemical removal of said spaced lines; and using the spaced lines of reduced lateral width as masking in one or more etchings of contact openings through insulative material to the node locations in a self-aligning manner to the insulative caps and the insulative sidewalls of the conductive line constructions.

18. The method of claim 17 wherein multiple of said etchings are conducted, a former of said etchings forming a hardmask in hardmasking material, a latter of said etchings being into insulative material below the hardmasking material using the hardmask as said masking.

19. The method of claim 17 wherein the spaced lines whose widths are reduced consist essentially of photoresist.

20. The method of claim 17 wherein the spaced lines whose widths are reduced consist essentially of amorphous carbon.

21. A method of forming plugged contact openings in the fabrication of integrated circuitry, comprising:

depositing photoresist over an antireflective coating which is received over a material to be etched, the material to be etched being received over a plurality of spaced conductive line constructions, the conductive line constructions comprising insulative caps and insulative sidewalls;

patterning the photoresist to form a mask comprising a plurality of spaced lines and trench spaces between adjacent of the spaced lines, the spaced lines and the trench spaces angling relative to the conductive line constructions, the trench spaces extending to the antireflective coating and being received over node locations received between adjacent of the conductive line constructions;

treating the photoresist with a plasma to reduce lateral width of the spaced lines and to increase lateral width of the trench spaces, the plasma comprising chemically inert and chemically reactive components to said photoresist, the reducing of lateral width of the spaced lines occurring by greater physical removal than by chemical removal of said photoresist;

after the treating, etching contact openings through the antireflective coating and the material to be etched to the node locations selectively relative to the insulative caps and the insulative sidewalls; and forming conductive material within the contact openings in electrical connection with the node locations.

22. The method of claim 21 comprising a hardmask material intermediate the material to be etched and the antireflective coating.

23. A method of forming contact openings in the fabrication of integrated circuitry, comprising:

forming a mask over a plurality of spaced conductive line constructions, the conductive line constructions comprising insulative caps and insulative sidewalls, the mask comprising a plurality of spaced lines and trench spaces between adjacent of the spaced lines, the spaced lines and the trench spaces angling relative to the conductive line constructions, the trench spaces being received over node locations received between adjacent of the conductive line constructions;

treating the spaced lines with a plasma to reduce lateral width of the spaced lines and to increase lateral width of the trench spaces, the plasma comprising chemically inert and chemically reactive components to said spaced lines, the reducing of lateral width of the spaced lines occurring by greater physical removal than by chemical removal of said spaced lines; and after the treating, etching contact openings to the node locations selectively relative to the insulative caps and the insulative sidewalls.

24. The method of claim 23 wherein the treating is conducted to be self-limiting to the reducing of the lateral width of the spaced lines and to the increasing of the lateral width of the trench spaces.

25. The method of claim 23 wherein the treating is conducted to be self-limiting to the reducing of the lateral width of the spaced lines and to the increasing of the lateral width of the trench spaces along opposing directions parallel to the conductive line constructions.

26. A method of forming contact openings in the fabrication of integrated circuitry, comprising:

forming a mask over a plurality of spaced conductive line constructions, the conductive line constructions comprising insulative caps and insulative sidewalls, the mask comprising a plurality of spaced lines and trench spaces between adjacent of the spaced lines, the spaced lines and the trench spaces angling relative to the conductive line constructions, the spaced lines individually being of a constant lateral width along at least a majority of their length, said constant lateral width being of at least two different values for different of the spaced lines among the plurality of spaced lines, the trench spaces being received over node locations received between adjacent of the conductive line constructions;

treating the spaced lines with a plasma to reduce said constant lateral width of the wider of the spaced lines by a larger amount than any reducing of said constant lateral width of the narrower of the spaced lines; and after the treating, etching contact openings to the node locations selectively relative to the insulative caps and the insulative sidewalls.

27. The method of claim 26 wherein the treating reduces said constant lateral width of the narrower of the spaced lines, the treating being conducted to be self-limiting to the reducing of said constant lateral widths of all of the spaced lines.

28. The method of claim 26 wherein the treating reduces said constant lateral width of the narrower of the spaced lines, the treating reducing said constant lateral width of wider of the spaced lines to be within 10% of said constant lateral width of narrower of the spaced lines after the treating.

29. The method of claim 28 wherein the treating is conducted to be self-limiting to the reducing of said constant lateral widths of all of the spaced lines.

30. The method of claim 26 wherein widest of the spaced lines are more than 50% wider than the value of the narrowest of the spaced lines before the treating, the treating reducing said constant lateral width of the narrowest of the spaced lines, the treating reducing said constant lateral width of widest of the spaced lines to be within 10% of said constant lateral width of narrowest of the spaced lines after the treating.

31. The method of claim 30 wherein the treating is conducted to be self-limiting to the reducing of said constant lateral widths of all of the spaced lines.

32. The method of claim 30 wherein the treating reduces said constant lateral width of widest of the spaced lines to be within 5% of said constant lateral width of narrowest of the spaced lines after the treating.

* * * * *

UNITED STATES PATENT AND TRADEMARK OFFICE
CERTIFICATE OF CORRECTION

PATENT NO. : 8,507,380 B2
APPLICATION NO. : 12/815574
DATED : August 13, 2013
INVENTOR(S) : Mark Kiehlbauch et al.

Page 1 of 1

It is certified that error appears in the above-identified patent and that said Letters Patent is hereby corrected as shown below:

In the Claims:

In column 8, line 23, in Claim 3, delete "parallel the" and insert -- parallel to the --, therefor.

Signed and Sealed this
Fifth Day of November, 2013

Teresa Stanek Rea
*Deputy Director of the United States Patent and Trademark Office*